(12) United States Patent
Kikuchi et al.

(10) Patent No.: US 12,349,414 B2
(45) Date of Patent: Jul. 1, 2025

(54) SEMICONDUCTOR DEVICE

(71) Applicant: Sharp Display Technology Corporation, Kameyama (JP)

(72) Inventors: Tetsuo Kikuchi, Kameyama (JP); Tohru Daitoh, Kameyama (JP); Masahiko Suzuki, Kameyama (JP); Setsuji Nishimiya, Kameyama (JP); Kengo Hara, Kameyama (JP); Hitoshi Takahata, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 486 days.

(21) Appl. No.: 17/835,273

(22) Filed: Jun. 8, 2022

(65) Prior Publication Data
US 2022/0406942 A1  Dec. 22, 2022

(30) Foreign Application Priority Data
Jun. 16, 2021  (JP) .................. 2021-100186

(51) Int. Cl.
*H10D 30/67* (2025.01)
(52) U.S. Cl.
CPC ..... *H10D 30/6755* (2025.01); *H10D 30/6757* (2025.01)
(58) Field of Classification Search
CPC .......... H01L 29/7869; H01L 29/78696; H10D 30/6755; H10D 30/6757; H10D 30/6734
See application file for complete search history.

(56) References Cited

U.S. PATENT DOCUMENTS

| 2008/0035920 A1 | 2/2008 | Takechi et al. |
| 2012/0138922 A1 | 6/2012 | Yamazaki et al. |
| 2012/0319114 A1 | 12/2012 | Yamazaki et al. |

(Continued)

FOREIGN PATENT DOCUMENTS

| JP | 2008-040343 A | 2/2008 |
| JP | 2012-134475 A | 7/2012 |

(Continued)

*Primary Examiner* — Christine A Enad
(74) *Attorney, Agent, or Firm* — Keating & Bennett, LLP

(57) ABSTRACT

Each first thin film transistor of a semiconductor device includes: a lower electrode; a first oxide semiconductor layer including a channel region and first and second contact regions; a gate electrode disposed on the channel region with a gate insulating layer interposed therebetween; and a source electrode and a drain electrode connected to the first contact region and the second contact region, respectively. When viewed from a normal direction of the substrate, at least a part of the channel region overlaps the lower electrode, and at least one of the first and second contact regions is located outside the lower electrode. The channel region has a layered structure including a lower layer, an upper layer located between the lower layer and the gate insulating layer, and a high mobility layer disposed between the lower layer and the upper layer and having mobility higher than mobility of the lower layer and the upper layer. In the channel region, the thickness of the upper layer is equal to or less than 1/3 of the thickness of the lower layer, and the thickness of the high mobility layer is equal to or less than 1/2 of the thickness of the lower layer.

14 Claims, 27 Drawing Sheets

(56) References Cited

U.S. PATENT DOCUMENTS

| | | | |
|---|---|---|---|
| 2013/0320334 A1 | 12/2013 | Yamazaki et al. | |
| 2014/0286076 A1 | 9/2014 | Aoki et al. | |
| 2016/0172500 A1* | 6/2016 | Yamazaki | C23C 14/3414 257/43 |
| 2020/0161340 A1* | 5/2020 | Jintyou | H10D 86/411 |
| 2020/0203534 A1* | 6/2020 | Park | H10D 30/6755 |

FOREIGN PATENT DOCUMENTS

| | | |
|---|---|---|
| JP | 2013-021312 A | 1/2013 |
| JP | 2014-007399 A | 1/2014 |
| JP | 2014-209727 A | 11/2014 |

\* cited by examiner

SEMICONDUCTOR DEVICE

CROSS-REFERENCE TO RELATED APPLICATIONS

This application claims the benefit of priority to Japanese Patent Application Number 2021-100186 filed on Jun. 16, 2021. The entire contents of the above-identified application are hereby incorporated by reference.

BACKGROUND

Technical Field

The present disclosure relates to a semiconductor device including a thin film transistor using an oxide semiconductor, and an active matrix substrate including such a thin film transistor.

An active matrix substrate used in a liquid crystal display device or the like is provided with a switching element, such as a thin film transistor (hereinafter referred to as a "TFT"), for each pixel. As such a TFT (hereinafter referred to as a "pixel TFT"), a TFT including an amorphous silicon film serving as an active layer (hereinafter referred to as an "amorphous silicon TFT") and a TFT including a polycrystalline silicon film serving as an active layer (hereinafter referred to as a "polycrystalline silicon TFT") are widely used in the related art.

On the other hand, a technique for monolithically (integrally) providing a peripheral circuit such as a drive circuit on a substrate is known. By forming the drive circuit monolithically, a non-display region is narrowed and the mounting process is simplified, resulting in cost reduction. In the present specification, the TFT constituting the peripheral circuit monolithically formed on the active matrix substrate is referred to as a "circuit TFT".

In recent years, as a material for the active layer of the TFT, an oxide semiconductor is sometimes used in place of an amorphous silicon or a polycrystalline silicon. Such a TFT is referred to as an "oxide semiconductor TFT". The oxide semiconductor has mobility higher than that of amorphous silicon. Thus, the oxide semiconductor TFT can operate at a higher speed than an amorphous silicon TFT. Therefore, the oxide semiconductor TFT can be suitably used not only as a pixel TFT but also as a circuit TFT.

Although many oxide semiconductor TFTs have a bottom gate structure, an oxide semiconductor TFT having a top gate structure is also proposed. In the top gate structure, a gate electrode (upper gate) is provided on a part of an oxide semiconductor layer with a gate insulating layer interposed therebetween. For example, JP 2013-021312 A discloses an oxide semiconductor TFT having a top gate structure, and including, as an active layer, a layered semiconductor layer formed by layering a plurality of oxide semiconductor layers. Note that, in the present specification, a TFT structure including a layered semiconductor layer as an active layer may be referred to as a "layered channel structure".

SUMMARY

In an oxide semiconductor TFT having a top gate structure, a lower electrode that may function as a light blocking layer may be provided on a substrate side of an oxide semiconductor layer to become an active layer. In some cases, the lower electrode may also function as an additional gate electrode (lower gate).

As a result of discussions by the present inventors, it has been found out that a variation in characteristics of the oxide semiconductor TFT may occur due to a step caused by the lower electrode in the TFT structure as described above, and reliability may decrease. However, when the oxide semiconductor layer to become the active layer is simply made thicker in order to suppress an influence of the step, mobility as the TFT may decrease, and a threshold voltage may be shifted. Thus, there is a possibility that desired TFT characteristics are not be obtained.

An embodiment of the present disclosure has been conceived in light of the above-described circumstances, and an object of the present disclosure is to provide a semiconductor device including a thin film transistor that has high mobility and can suppress a decrease in reliability.

The present specification discloses a semiconductor device according to the following items.

Item 1

A semiconductor device, including:

a substrate; and at least one first thin film transistor supported by the substrate, wherein each first thin film transistor includes a lower electrode formed on the substrate, a first oxide semiconductor layer disposed on the lower electrode with a lower insulating layer interposed between the first oxide semiconductor layer and the lower electrode, the first oxide semiconductor layer including, when viewed from a normal direction of the substrate, a channel region, a first contact region, and a second contact region, the first contact region and the second contact region being respectively located on both sides of the channel region, a first gate electrode disposed on the channel region of the first oxide semiconductor layer with a first gate insulating layer interposed between the first gate electrode and the channel region, a first source electrode electrically connected to the first contact region, and a first drain electrode electrically connected to the second contact region, when viewed from the normal direction of the substrate, at least a part of the channel region of the first oxide semiconductor layer overlaps the lower electrode, and at least one of the first contact region and the second contact region is located outside the lower electrode, the channel region of the first oxide semiconductor layer has a layered structure including a lower layer, an upper layer located between the lower layer and the first gate insulating layer, and a high mobility layer disposed between the lower layer and the upper layer and having mobility higher than mobility of the lower layer and the upper layer, and, in the channel region, a thickness tb of the upper layer is equal to or less than 1/3 of a thickness ta of the lower layer, and a thickness tm of the high mobility layer is equal to or less than 1/2 of the thickness ta of the lower layer.

Item 2

The semiconductor device according to item 1, wherein the thickness tm of the high mobility layer is equal to or greater than 4 nm and equal to or less than 12 nm.

Item 3

The semiconductor device according to item 1 or 2, wherein the thickness tb of the upper layer is equal to or greater than 1/10 of the thickness ta of the lower layer.

Item 4

The semiconductor device according to any one of items 1 to 3, wherein the thickness tb of the upper layer is equal to or greater than 2/5 and equal to or less than 3/2 of the thickness tm of the high mobility layer.

Item 5

The semiconductor device according to any one of items 1 to 4, wherein a thickness of the channel region of the first oxide semiconductor layer is equal to or greater than 30 nm.

Item 6

The semiconductor device according to any one of items 1 to 5, wherein the thickness tb of the upper layer is equal to or greater than 2 nm and equal to or less than 12 nm.

Item 7

The semiconductor device according to any one of items 1 to 6, wherein, when viewed from the normal direction of the substrate, the first oxide semiconductor layer includes a low-resistive portion having a specific resistance smaller than a specific resistance of the channel region, the low-resistive portion being located between the channel region, and the first contact region and the second contact region, and the low-resistive portion includes at least the high mobility layer and the lower layer.

Item 8

The semiconductor device according to item 7, wherein the high mobility layer is exposed from an upper surface of the low-resistive portion.

Item 9

The semiconductor device according to any one of items 1 to 8, wherein a thickness of the first gate insulating layer is smaller than a thickness of the lower insulating layer.

Item 10

The semiconductor device according to any one of items 1 to 9, wherein the lower electrode is electrically connected to the first gate electrode.

Item 11

The semiconductor device according to any one of items 1 to 10, further including at least one second thin film transistor supported by the substrate, wherein each second thin film transistor includes a second oxide semiconductor layer different from the first oxide semiconductor layer, and a second gate electrode disposed on a part of the second oxide semiconductor layer with a second gate insulating layer interposed between the second gate electrode and the part of the second oxide semiconductor layer, the second gate insulating layer has a layered structure including a first insulating film and a second insulating film disposed on the first insulating film, the first gate insulating layer of the first thin film transistor includes the second insulating film and does not include the first insulating film, and the first thin film transistor further includes an insulating layer between the first oxide semiconductor layer and the lower insulating layer, the insulating layer being formed of the first insulating film.

Item 12

The semiconductor device according to item 11, wherein a side surface of the first oxide semiconductor layer and a side surface of the insulating layer are aligned with each other.

Item 13

The semiconductor device according to item 11 or 12, wherein the second oxide semiconductor layer has mobility lower than the mobility of the high mobility layer of the first oxide semiconductor layer.

Item 14

The semiconductor device according to any one of items 10 to 13, wherein the semiconductor device is an active matrix substrate.

Item 15

The semiconductor device according to any one of items 11 to 13, wherein the semiconductor device is an active matrix substrate including a display region including a plurality of pixel areas, and a non-display region located in a periphery of the display region and including a peripheral circuit, the active matrix substrate includes a plurality of circuit TFTs disposed in the non-display region and constituting the peripheral circuit, and a plurality of pixel TFTs each disposed in a corresponding one of the plurality of pixel areas, the plurality of circuit TFTs include the at least one first thin film transistor, and the plurality of pixel TFTs include the at least one second thin film transistor.

According to an embodiment of the present disclosure, a device including a thin film transistor that has high mobility, and can reduce a variation in characteristics or can suppress a decrease in reliability is provided.

BRIEF DESCRIPTION OF DRAWINGS

The disclosure will be described with reference to the accompanying drawings, wherein like numbers reference like elements.

DESCRIPTION OF EMBODIMENTS

First Embodiment

Hereinafter, a semiconductor device according to a first embodiment will be described with reference to the accompanying drawings. The semiconductor device according to the present embodiment includes a substrate, and an oxide semiconductor TFT supported by the substrate. The oxide semiconductor TFT has a layered channel structure. It is sufficient that the semiconductor device according to the present embodiment include at least one oxide semiconductor TFT, the semiconductor device widely including circuit substrates, such as an active matrix substrate, various display devices, electronic devices, and the like. Hereinafter, an example in which the oxide semiconductor TFT has a double gate structure including two gate electrodes sandwiching an active layer will be described. However, a structure of the oxide semiconductor TFT according to the present embodiment is not limited to the double gate structure, and may be a top gate structure.

Figure 1A:
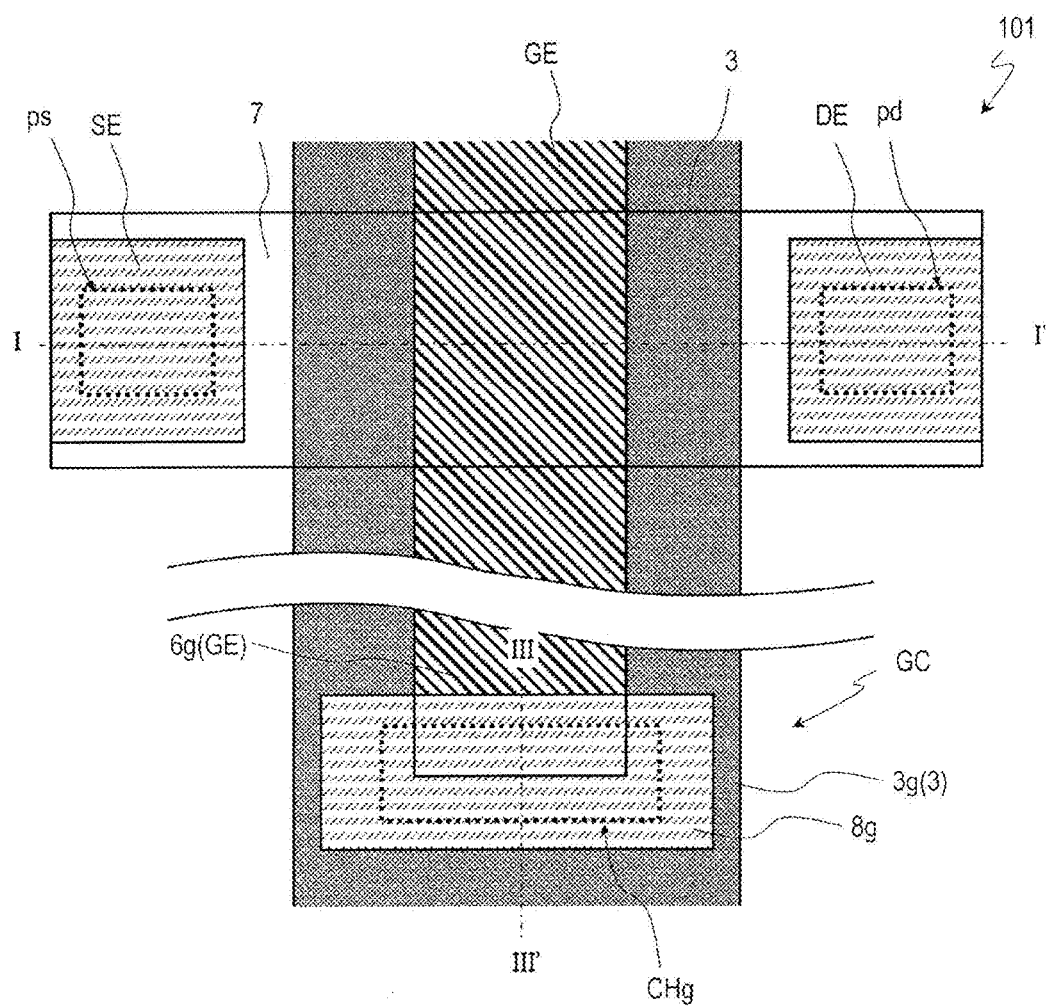
FIG. 1A is a schematic plan view illustrating an example of an oxide semiconductor TFT 101 according to a first embodiment.
Figure 1B:
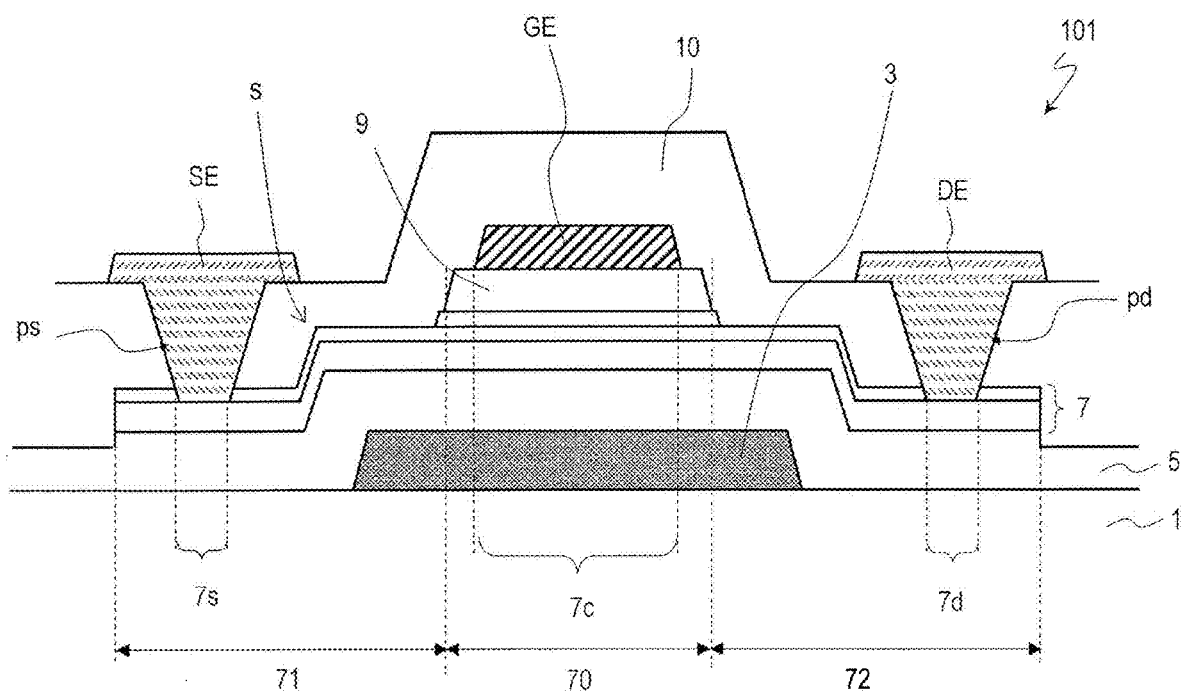
FIG. 1B is a cross-sectional view taken along a line I-I' illustrated in FIG. 1A.

FIG. 1A is a schematic plan view illustrating an example of the semiconductor device according to the present embodiment. FIG. 1B is a cross-sectional view taken along a line I-I' illustrated in FIG. 1A.

The semiconductor device according to the present embodiment includes a substrate 1, and an oxide semiconductor TFT (hereinafter simply referred to as a "TFT") 101 supported by the substrate 1.

The TFT 101 includes a lower electrode 3 formed on the substrate 1, a lower insulating layer 5 that covers the lower electrode 3, an oxide semiconductor layer 7 disposed on the lower insulating layer 5, and a gate electrode GE disposed on a part of the oxide semiconductor layer 7 with a gate insulating layer 9 interposed therebetween. When viewed from a normal direction of the substrate 1, a portion of the oxide semiconductor layer 7 overlapping the gate electrode GE is referred to as a "channel region 7c". The TFT 101 may further include a source electrode SE and a drain electrode DE that are electrically connected to the oxide semiconductor layer 7.

The oxide semiconductor layer 7 includes, when viewed from the normal direction of the substrate 1, a region 70 including the channel region 7c, and a first region 71 and a second region 72 located on both sides of the channel region 7c. The first region 71 and the second region 72 may be low-resistive regions having a specific resistance lower than that of the region (hereinafter referred to as a "high-resistive region") 70 including the channel region 7c. The low-resistive region may be a conductive region.

The first region 71 includes a region (hereinafter referred to as a "first contact region") 7s electrically connected to the source electrode SE. The second region 72 includes a region (hereinafter referred to as a "second contact region") 7d electrically connected to the drain electrode DE. The first contact region 7s may be in direct contact with the source electrode SE, and the second contact region 7d may be in direct contact with the drain electrode DE.

Note that, when the TFT 101 is provided in a circuit, the first contact region 7s and/or the second contact region 7d may be in direct contact with a wiring line or an electrode in the circuit. In that case, a portion of the wiring line/electrode in the circuit connected to the first contact region 7s may be referred to as the source electrode SE, and a portion of the wiring line/electrode in the circuit connected to the second contact region 7d may be referred to as the drain electrode DE.

The oxide semiconductor layer 7 is disposed on the lower electrode 3 with the lower insulating layer 5 interposed therebetween. When viewed from the normal direction of the substrate 1, only a part of the oxide semiconductor layer 7 overlaps the lower electrode 3. Thus, in the cross section perpendicular to the substrate 1, the oxide semiconductor layer 7 may have a step s reflecting a shape of the lower electrode 3. For example, the step s may be formed around a portion of the oxide semiconductor layer 7 located above the lower electrode 3. In a lower surface of the oxide semiconductor layer 7, the height of the step s in the normal direction of the substrate 1 may be, for example, equal to or more than 1/3 of the thickness of the lower electrode 3 and less than the thickness of the lower electrode 3.

When viewed from the normal direction of the substrate 1, at least a part of the channel region 7c may overlap the lower electrode 3, and at least one of the first contact region 7s and the second contact region 7d may be located outside the lower electrode 3. When viewed from the normal direction of the substrate 1, an edge of the lower electrode 3 may cross the channel region 7c in a channel width direction, or may cross a low-resistive portion located between the channel region 7c, and the first contact region 7s and/or the second contact region 7d in the channel width direction. The step s of the oxide semiconductor layer 7 may be formed between the first contact region 7s and the second contact region 7d so as to correspond to the edge of the lower electrode 3. In this example, when viewed from the normal direction of the substrate 1, the entire channel region 7c overlaps the lower electrode 3, and the first contact region 7s and the second contact region 7d are each located outside the step s. An upper surface of the channel region 7c is located higher than an upper surface of the first contact region 7s and the second contact region 7d.

The oxide semiconductor layer 7 is a layered semiconductor layer having a layered structure. In this example, the oxide semiconductor layer 7 has a triple-layer structure including a lower oxide semiconductor layer (hereinafter simply referred to as a "lower layer") La, an upper oxide semiconductor layer (hereinafter simply referred to as an "upper layer") Lb located between the lower layer La and the gate insulating layer 9, and a middle oxide semiconductor layer Lm located between the upper layer Lb and the lower layer La. The middle oxide semiconductor layer Lm has mobility higher than that of the upper layer Lb and the lower layer La. Hereinafter, the middle oxide semiconductor layer Lm is referred to as a "high mobility layer". Further, the upper layer Lb and the lower layer La may be collectively referred to as a "low mobility layer". The layered structure of the oxide semiconductor layer 7 may include the three layers described above in a predetermined order, and may include four or more oxide semiconductor layers. In the example illustrated in FIG. 1B, the oxide semiconductor layer 7 has a triple-layer structure, and the upper layer Lb is in direct contact with the gate insulating layer 9.

In the present embodiment, at least the channel region 7c of the oxide semiconductor layer 7 may have the layered structure described above. For example, the first region 71 and the second region 72 include the high mobility layer Lm and the lower layer La, but may not include the upper layer Lb. The layered structure of the oxide semiconductor layer 7 will be described below in detail.

The gate insulating layer 9 is disposed on at least the channel region 7c of the oxide semiconductor layer 7. In this example, the oxide semiconductor layer 7 is disposed to cover the high-resistive region 70 including the channel region 7c and expose the first region 71 and the second region 72 that are the low-resistive regions. Such a structure is obtained by performing resistance lowering processing of the oxide semiconductor layer 7 with the gate insulating layer 9 as a mask.

The gate electrode GE is disposed on the gate insulating layer 9 to overlap the channel region 7c of the oxide semiconductor layer 7 when viewed from the normal direction of the substrate 1. The gate electrode GE may be disposed to overlap the channel region 7c and expose the first region 71 and the second region 72 when viewed from the normal direction of the substrate 1. A side surface of the gate electrode GE may be aligned with a side surface of the gate insulating layer 9. Such a structure is obtained by, for example, patterning the gate electrode GE, and then patterning the gate insulating layer 9 by using the same mask as that of the gate electrode GE (or using the gate electrode GE as a mask).

When viewed from the normal direction of the substrate 1, the high-resistive region 70 of the oxide semiconductor layer 7 may include an offset region. The offset region is a region that overlaps the gate insulating layer 9 (or a tapered portion thereof), but does not overlap the gate electrode GE. The offset region is located between the channel region 7c and the low-resistive region, for example.

The lower electrode 3 may function as a light blocking layer, for example. The lower electrode 3 at least partially overlaps the channel region 7c of the TFT 101 when viewed from the normal direction of the substrate 1. The lower electrode 3 may be disposed to overlap the entire channel region 7c when viewed from the normal direction of the substrate 1. In this manner, the deterioration in characteristics of the oxide semiconductor layer 7 caused by light (backlight light) from the substrate 1 side can be more effectively suppressed.

The lower electrode 3 may function as a lower gate electrode of the TFT 101. In the illustrated example, the lower electrode 3 is electrically connected to the gate electrode GE in a gate connection section GC described below. At this time, the lower insulating layer 5 functions as a gate insulating layer (also referred to as a "lower gate insulating layer"). In this way, the TFT structure including two gate electrodes (an upper gate electrode and a lower gate electrode) sandwiching the oxide semiconductor layer 7 is referred to as a "double gate structure".

Note that the lower electrode 3 may be fixed to a fixed potential (for example, a source potential), or may be electrically in a floating state. In this way, the TFT structure including the gate electrode (upper gate electrode) GE only on the side opposite to the substrate 1 of the oxide semiconductor layer 7 is referred to as a "top gate structure".

The lower insulating layer 5 is preferably thicker than the gate insulating layer 9. In this manner, the step s of the oxide semiconductor layer 7 formed due to the lower electrode 3 can be reduced. Further, by reducing the thickness of the gate insulating layer 9, ON characteristics of the TFT 101 can be ensured.

The oxide semiconductor layer 7, the gate insulating layer 9, and the gate electrode GE may be covered by an interlayer insulating layer 10. As the interlayer insulating layer 10, a reductive insulating film (for example, a silicon nitride film) capable of reducing an oxide semiconductor may be used. This makes it possible to suppress an increase in specific resistance of a portion of the oxide semiconductor layer 7 in contact with the interlayer insulating layer 10.

The source electrode SE and the drain electrode DE may be disposed on the interlayer insulating layer 10. In the illustrated example, a first opening ps that exposes the first contact region 7s and a second opening pd that exposes the second contact region 7d are formed in the interlayer insulating layer 10. The source electrode SE is formed on the interlayer insulating layer 10 and in the first opening ps, and is connected to the first contact region 7s of the oxide semiconductor layer 7 in the first opening ps. The drain electrode DE is formed on the interlayer insulating layer 10 and in the second opening pd, and is connected to the second contact region 7d of the oxide semiconductor layer 7 in the second opening pd. Note that, in the illustrated example, the source electrode SE and the drain electrode DE are formed by using the same conductive film (i.e., in the same layer), but may be formed by using conductive films different from each other (i.e., in separate layers).

Layered Structure of Oxide Semiconductor Layer 7

As described above, the oxide semiconductor layer 7 in the present embodiment has the layered structure including the lower layer La, the high mobility layer Lm, and the upper layer Lb in this order from the substrate 1 side (lower insulating layer 5 side). The high mobility layer Lm has mobility higher than that of the upper layer Lb and the lower layer La. In other words, the high mobility layer Lm has a band gap lower than that of the upper layer Lb and the lower layer La. Note that the high mobility layer Lm may have a relatively high mobility, and the mobility of the high mobility layer Lm is not particularly limited. The mobility of the high mobility layer Lm may be, for example, equal to or greater than 10 cm$^2$/Vs.

At least the channel region 7c of the oxide semiconductor layer 7 may have the layered structure described above. For example, the oxide semiconductor layer 7 may have the layered structure between the gate insulating layer 9 and the lower insulating layer 5. In the present specification, thicknesses of the upper layer Lb, the lower layer La, and the high mobility layer Lm in the channel region 7c are thicknesses tb, ta, and tm, respectively.

In the present embodiment, the thickness of the lower layer La is greater than the thickness of the upper layer Lb and the high mobility layer Lm in the channel region 7c of the oxide semiconductor layer 7. The thickness tb of the upper layer Lb may be equal to or less than 1/3 of the thickness ta of the lower layer La, and the thickness tm of the high mobility layer Lm may be equal to or less than 1/2 of the thickness ta of the lower layer La.

$$tb \leq 1/3 ta \text{ and } tm \leq 1/2 ta \tag{1}$$

Effect by Layered Structure

The channel region 7c of the oxide semiconductor layer 7 has the layered structure, and thus step disconnection of the oxide semiconductor layer 7 caused by the lower electrode 3 can be suppressed while ensuring desired TFT characteristics (threshold voltage and TFT mobility). Note that, in the present specification, mobility as the TFT is referred to as "TFT mobility", and is distinguished from mobility of an oxide semiconductor material itself.

In a known TFT including a lower electrode (light blocking layer), there is a problem that a step is generated in an oxide semiconductor layer due to the lower electrode, which may cause step disconnection of the oxide semiconductor layer. Particularly, when step disconnection occurs in a portion of the oxide semiconductor layer located between a source and a drain, characteristics and reliability of the TFT may decrease. In order to prevent this, increasing the thickness of the oxide semiconductor layer to a certain extent (for example, to equal to or more than 30 nm) is conceivable. However, as a result of discussions by the present inventors, simply increasing the thickness of the oxide semiconductor layer is not enough, and desired TFT characteristics may not be obtained and reliability may decrease due to a reason other than step disconnection. For example, in a TFT including an active layer of a single layer structure formed of a high mobility oxide semiconductor layer having high mobility, when the high mobility oxide semiconductor layer is made thick, there is a possibility that a threshold voltage of the TFT shifts to a negative side due to deterioration (light degradation) due to backlight light.

In contrast, in the present embodiment, the active layer of the TFT 101 has the layered structure that satisfies (1) described above. In other words, (I-1) a relatively thick lower layer La is provided closer to the substrate 1 side than the high mobility layer Lm, and (I-2) a relatively thin upper layer Lb (herein having a thickness equal to or less than 1/3 of the lower layer La) is provided on the high mobility layer Lm.

According to the configuration of (I-1), a total thickness of the oxide semiconductor layer 7 can be increased without increasing the thickness tm of the high mobility layer Lm. The total thickness of the oxide semiconductor layer 7 can be increased, and thus step disconnection of the oxide semiconductor layer 7 can be suppressed. Further, since the thickness of the high mobility layer Lm does not need to be significantly increased, a negative shift of a threshold voltage due to light degradation of the high mobility layer Lm can be suppressed. Furthermore, since the high mobility layer Lm is located closer to the gate insulating layer 9 side than the relatively thick lower layer La, a decrease in mobility due to the lower layer La being provided can be suppressed.

Further, by (I-2), damage caused by film formation of the gate insulating layer 9 to a portion that becomes a channel of the high mobility layer Lm can be reduced. Further, a surface portion of the low-resistive region (the first region 71 and the second region 72) of the oxide semiconductor layer 7 may be overetched during patterning of the gate insulating layer 9. However, even in such a case, the high mobility layer Lm can be left without removing the high mobility layer Lm. Since the low-resistive region generated by lowering resistance of the high mobility layer Lm has a specific resistance lower than that of the low-resistive region of the low mobility layer, resistance of the low-resistive region can be further reduced by forming the low-resistive region including the high mobility layer Lm. As a result, ON resistance of the TFT 101 can be reduced. Note that the upper layer Lb is thin, and thus the mobility of the TFT 101 can be maintained high even when the upper layer Lb is provided between the high mobility layer Lm and the gate insulating layer 9.

Thickness of Each Layer of Oxide Semiconductor Layer 7

Hereinafter, the thickness of each layer in the channel region 7c of the oxide semiconductor layer 7 will be described. In a portion of the oxide semiconductor layer 7 located outside the channel region 7c, for example, in a portion located outside the gate insulating layer 9, the upper layer Lb, the high mobility layer Lm, or the lower layer La may be partially removed and thinned, or the upper layer Lb and the high mobility layer Lm may be entirely removed and not be present.

Figure 2:
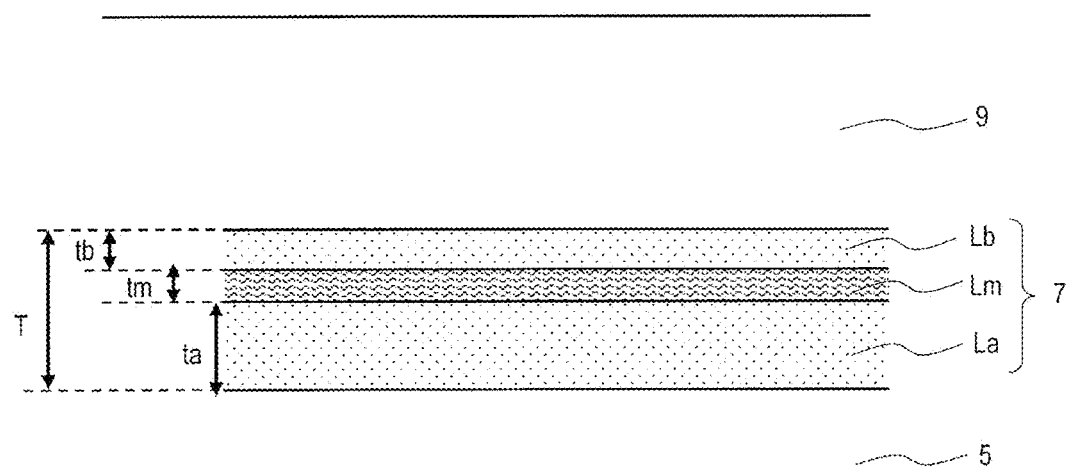
FIG. 2 is an enlarged cross-sectional view of an oxide semiconductor layer 7.

FIG. 2 is an enlarged cross-sectional view of the channel region 7c of the oxide semiconductor layer 7. The upper layer Lb, the high mobility layer Lm, and the lower layer La in the channel region 7c have the thickness tb, the thickness tm, the thickness ta, respectively. The thickness of the entire channel region 7c, i.e., the thickness from an upper surface of the lower insulating layer 5 to a lower surface of the gate insulating layer 9, is a "total thickness T". In this example, the total thickness T is the summed total thickness of the upper layer Lb, the high mobility layer Lm, and the lower layer La.

The total thickness T (herein the summed total thickness of the three layers) of the channel region 7c of the oxide semiconductor layer 7 may be, for example, equal to or more than 30 nm, depending on the thickness of the lower electrode 3 and the lower insulating layer 5. In this manner, step disconnection of the oxide semiconductor layer 7 can be more effectively suppressed. The thickness T of the oxide semiconductor layer 7 is more preferably equal to or more than 40 nm. On the other hand, when the total thickness T is equal to or less than 80 nm, a step generated in an upper layer such as the interlayer insulating layer 10 can be reduced. Further, since an increase in the thickness ta of the lower layer La can be suppressed, ON characteristics can be increased by causing the lower electrode 3 to function as a lower gate electrode.

In the present embodiment, the thickness ta of the lower layer La is greater than the thicknesses tb and tm of the upper layer Lb and the high mobility layer Lm. The total thickness T is increased to a predetermined thickness by increasing the thickness of the lower layer La, and thus step disconnection can be suppressed.

The thickness tb of the upper layer Lb is, for example, equal to or less than 1/3 of the thickness ta of the lower layer La. In this manner, a decrease in ON current due to the upper layer Lb disposed on the high mobility layer Lm on the gate insulating layer 9 side can be more reliably suppressed while ensuring the total thickness T. On the other hand, the thickness tb of the upper layer Lb may be equal to or more than 1/10 of the thickness ta of the lower layer La. When the thickness tb is equal to or more than 1/10, damage caused by film formation of the gate insulating layer 9 to the high mobility layer Lm can be more effectively suppressed. Further, the removal of the high mobility layer Lm by overetching during patterning of the gate insulating layer 9 can be suppressed, and thus the low-resistive region (the first region 71 and the second region 72 illustrated in FIG. 1B) including the high mobility layer Lm can be formed. Therefore, resistance of the low-resistive region can be further reduced, and thus ON characteristics of the TFT can be improved. More preferably, the thickness tb of the upper layer Lb may be equal to or greater than 1/7 of the thickness ta of the lower layer La.

The thickness tm of the high mobility layer Lm is, for example, equal to or less than 1/2 of the thickness ta of the lower layer La, and is preferably equal to or less than 1/3. In this manner, a negative shift of a threshold voltage due to light degradation of the high mobility layer Lm can be more effectively suppressed while ensuring the total thickness T. As an example, a threshold voltage can be set around 0 V by reducing the thickness of the high mobility layer Lm, and thus the TFT 101 having enhancement characteristics and also having a high ON current can be obtained. On the other hand, the thickness tm of the high mobility layer Lm may be equal to or more than 1/7 of the thickness to of the lower layer La. When the thickness tm is equal to or more than 1/7, a current path can be ensured, and thus an ON current can be more effectively increased.

The thickness tb of the upper layer Lb may be, for example, equal to or more than 2/5 of the thickness tm of the high mobility layer Lm. In this manner, damage to and overetching of the high mobility layer Lm due to patterning of the gate insulating layer 9 can be more effectively suppressed. The thickness tb of the upper layer Lb may be greater or smaller than the thickness tm of the high mobility layer Lm. Alternatively, the thickness tb may be equal to the thickness tm. In order to achieve high TFT mobility by more reliably causing the high mobility layer Lm to function as the channel, the thickness tb of the upper layer Lb may be, for example, equal to or less than 3/2 of the thickness tm of the high mobility layer Lm.

The thickness tb of the upper layer Lb may be equal to or greater than 2 nm and equal to or less than 12 nm. When the thickness tb is equal to or greater than 2 nm, damage to and overetching of the high mobility layer Lm can be more effectively suppressed. When the thickness tb is equal to or less than 12 nm, the high mobility layer Lm can be more reliably caused to function as the channel, and thus high TFT mobility can be obtained.

The thickness tm of the high mobility layer Lm may be equal to or greater than 4 nm and equal to or less than 12 nm. When the thickness tm is equal to or more than 4 nm, a current path in the high mobility layer Lm can be more reliably ensured, and thus an ON current can be more effectively increased. When the thickness tm is equal to or less than 12 nm, a negative shift of a threshold voltage due to light degradation can be more effectively suppressed.

The thickness ta of the lower layer La may be set such that the total thickness T of the oxide semiconductor layer 7 has a desired value. The thickness ta of the lower layer La may be, for example, equal to or more than 6 nm and equal to or less than 50 nm. When the thickness ta is equal to or more than 6 nm, step disconnection of the oxide semiconductor layer 7 can be more reliably suppressed by an increase in the thickness T of the oxide semiconductor layer 7. When the thickness ta is equal to or less than 50 nm, an ON current can be further increased with the lower electrode 3 functioning as a lower gate.

A preferable relationship and a preferable range of thickness of each layer of the oxide semiconductor layer 7 are summarized as follows. Note that all of the following relationships may not be satisfied. As described above, a certain effect can be obtained by satisfying at least (1) described above.

$1/10\, ta \le tb \le 1/3\, ta$ $1/7\, ta \le tm \le 1/2\, ta$ $2/5\, tm \le tb \le 3/2\, tm$ $30\ \text{nm} \le T \le 80\ \text{nm}$ $2\ \text{nm} \le tb \le 12\ \text{nm}$ $4\ \text{nm} \le tm \le 12\ \text{nm}$ $6\ \text{nm} \le ta \le 50\ \text{nm}$ For example, when the TFT 101 is manufactured by a method described below, a portion of the oxide semiconductor layer 7 that is not covered by the gate insulating layer 9 may be thinned due to the resistance lowering processing of the oxide semiconductor layer 7, patterning of the gate insulating layer 9, and the like. As a result, as illustrated in FIG. 1B, a portion (here, the low-resistive region) of the oxide semiconductor layer 7 that is not covered by the gate insulating layer 9 may be thinner than the portion (here, the high-resistive region) 70 located between the lower insulating layer 5 and the gate insulating layer 9. Even in this case, a portion (low-resistive portion) of the low-resistive region located between the first contact region 7s and the second contact region 7d, and the channel region 7c preferably includes at least the high mobility layer Lm and the lower layer La. By including the high mobility layer Lm, resistance of the low-resistive region can be further reduced.

In the example illustrated in FIG. 1B, the oxide semiconductor layer 7 has the triple-layer structure in the channel region 7c, but when viewed from the normal direction of the substrate 1, the upper layer Lb is removed in a portion that does not overlap the gate insulating layer 9, and the high mobility layer Lm is exposed. This structure is obtained by, for example, also removing the upper layer Lb of the oxide semiconductor layer 7 during etching of the gate insulating layer 9. In this manner, a part or all of the surface of the high mobility layer Lm is exposed from the surface of the low-resistive region (the first region 71 and the second region 72), and thus resistance of the low-resistive region can be further reduced.

The upper layer Lb may be left thin, or the upper layer Lb may be partially left in the first region 71 and the second region 72. At this time, the thickness of the high mobility layer Lm in the first region 71 and the second region 72 may be equal to the thickness tm in the channel region 7c. On the other hand, in the first region 71 and the second region 72, the upper layer Lb may be removed, and a surface portion of the high mobility layer Lm located below the upper layer Lb may also be removed. In this case, the thickness of the high mobility layer Lm in the first region 71 and the second region 72 is smaller than the thickness tm in the channel region 7c.

Furthermore, as illustrated in FIG. 1B, the upper layer Lb and the high mobility layer Lm may be removed in the first contact region 7s and the second contact region 7d. This structure is obtained by also removing the high mobility layer Lm during etching of the interlayer insulating layer 10. A surface portion of the lower layer La may also be removed. The source electrode SE and the drain electrode DE may be in direct contact with a portion of the high mobility layer Lm exposed from the side surface of the openings ps and pd, and a portion of the lower layer La exposed from the bottom surface of the openings ps and pd. In this manner, by increasing a contact area between the source electrode SE and/or the drain electrode DE, and the oxide semiconductor layer 7, and bringing the source electrode SE and/or the drain electrode DE into direct contact with the high mobility layer Lm, contact resistance can be more effectively reduced.

Note that a structure of the oxide semiconductor layer 7 is not limited to the structure illustrated in FIG. 1B. The surface of the low-resistive region of the oxide semiconductor layer 7 may be the surface of the upper layer Lb, or may be the surface of the lower layer La. Further, in the first contact region 7s and the second contact region 7d, the high mobility layer Lm may be exposed from the bottom surface of the openings ps and pd. Alternatively, the openings ps and pd may extend through the oxide semiconductor layer 7, and the source electrode SE and the drain electrode DE may each be in contact with the oxide semiconductor layer 7 through only the side surface of the openings ps and pd.

Composition of Each Layer of Oxide Semiconductor Layer 7

In the present embodiment, a composition of the upper layer Lb, the high mobility layer Lm, and the lower layer La is set such that the high mobility layer Lm can indicate mobility higher than that of the upper layer Lb and the lower layer La.

The upper layer Lb and the lower layer La being a low mobility layer may include In, Ga, and Zn. For example, the low mobility layer may mainly include an In—Ga—Zn—O based semiconductor. The compositions of the upper layer Lb and the lower layer La may be the same, or may be different from each other. The high mobility layer Lm being a high mobility layer may mainly include an In—Zn—O based semiconductor layer. Alternatively, the high mobility layer Lm may mainly include an oxide semiconductor including Sn. Examples of the oxide semiconductor including Sn include an In—Ga—Zn—Sn—O based semiconductor, an In—Ga—Sn—O based semiconductor, an In—Sn—Zn—O based semiconductor, and the like.

When the upper layer Lb and the lower layer La mainly include the In—Ga—Zn—O based semiconductor, and the high mobility layer Lm mainly includes the In—Zn—O based semiconductor, a ratio of In in the In—Ga—Zn—O based semiconductor of the upper layer Lb and the lower layer La may be, for example, equal to or greater than 1/3. The ratio (atomic number ratio) of In, Ga, and Zn in the In—Ga—Zn—O based semiconductor of the upper layer Lb and the lower layer La may be, for example, 1:1:1, 4:2:4, and the like.

When the upper layer Lb and the lower layer La mainly include the In—Ga—Zn—O based semiconductor, and the high mobility layer Lm mainly includes the oxide semiconductor including Sn, a composition of the In—Ga—Zn—O based semiconductor in the upper layer Lb and the lower layer La is not particularly limited. A ratio of In, Ga, and Zn in the upper layer Lb and the lower layer La may be, for example, 1:1:1, 4:2:4, 1:3:2, 1:3:6, and the like.

Here, In is referred to as a "first metal element", and Ga and Zn are each referred to as a "second metal element". It is known that, for example, mobility tends to increase with a higher ratio of the first metal element in the oxide semiconductor, whereas mobility tends to decrease and crystallinity tends to increase with a higher ratio of the second metal element. Therefore, when the oxide semiconductor includes the first metal element and at least one second metal element (Ga or Zn), an oxide semiconductor layer having a desired mobility can be formed by adjusting a ratio of the metal elements.

An atomic number ratio of In to all metal elements included in the high mobility layer Lm may be greater than an atomic number ratio of In to all metal elements included in the upper layer Lb and the lower layer La. As an example, an atomic number ratio of the first metal element to all metal elements included in the high mobility layer Lm may be equal to or greater than an atomic number ratio of the second metal element. Preferably, an atomic number ratio of the first metal element may be greater than an atomic number ratio of the second metal element. On the other hand, an atomic number ratio of the first metal element to all metal elements included in the upper layer Lb and the lower layer La may be equal to or less than an atomic number ratio of the second metal element.

The high mobility layer Lm, the lower layer La, and the upper layer Lb have the composition described above, and thus the high mobility layer Lm has mobility higher than that of the lower layer La and the upper layer Lb, and may function as a channel layer. Meanwhile, the upper layer Lb and the lower layer La are highly crystallized layers having crystallinity higher than that of the high mobility layer Lm, and have excellent etching resistance and barrier properties. Therefore, for example, in a patterning process of the gate insulating layer 9 and the gate electrode GE, the upper layer Lb may function as a protection layer and a sacrificing layer of the high mobility layer Lm.

Note that the high mobility layer Lm, and the lower layer La and the upper layer Lb may have the same composition. Even in this case, mobility of the high mobility layer Lm can be set higher than that of the lower layer La and the upper layer Lb by setting different formation conditions and crystal structures of each oxide semiconductor layer, for example.

Gate Connection Section GC

The lower electrode 3 of the TFT 101 may function as a lower gate. In this case, the gate connection section GC that electrically connects the gate electrode GE of the TFT 101 and the lower electrode 3 may be further provided on the substrate 1 of the semiconductor device.

Figure 3:
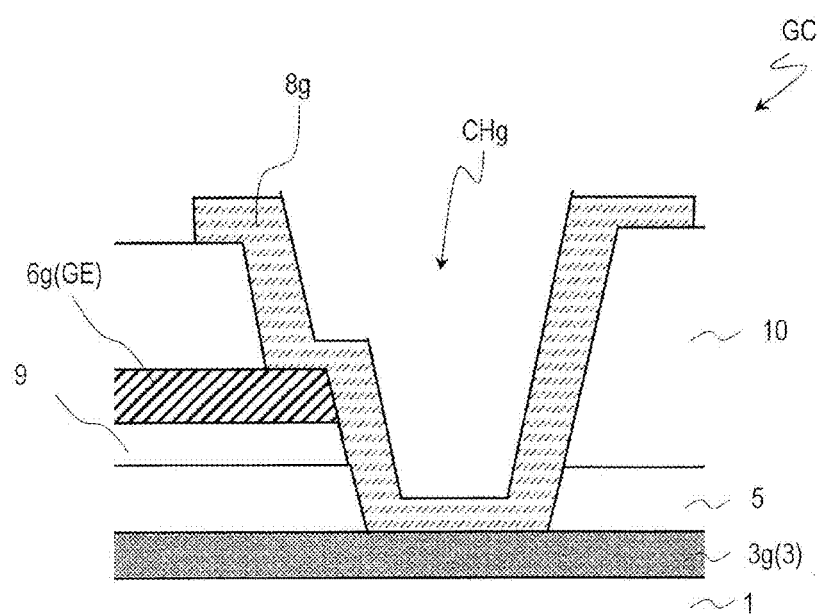
FIG. 3 is a cross-sectional view of a gate connection section taken along a line III-III' illustrated in FIG. 1A.

FIG. 3 is a cross-sectional view taken along a line III-III' illustrated in FIG. 1A, and illustrates a cross-sectional structure of the gate connection section GC.

The gate connection section GC includes a lower connection section 3g electrically connected to the lower electrode 3, an upper connection section 6g electrically connected to the gate electrode GE, and a connection electrode 8g that connects the lower connection section 3g and the upper connection section 6g. The lower connection section 3g may be connected to the lower electrode 3, and the upper connection section 6g may be connected to the gate electrode GE. The lower connection section 3g may be a part of an extending section of the lower electrode 3 or a wiring line integrally formed with the lower electrode 3. The upper connection section 6g may be a part of an extending section of the gate electrode GE or a wiring line integrally formed with the gate electrode GE. The connection electrode 8g may be formed in an upper layer above the gate electrode GE. For example, the connection electrode 8g may be in the same layer as the source electrode SE and the drain electrode DE, or may be formed in a layer located above the source electrode SE.

In the gate connection section GC, the upper connection section 6g is disposed to partially overlap the lower connection section 3g when viewed from the normal direction of the substrate 1. The lower insulating layer 5 and the interlayer insulating layer 10 are extended on the lower connection section 3g. The gate insulating layer 9 may be further extended between the upper connection section 6g and the lower insulating layer 5. The lower insulating layer 5, the gate insulating layer 9, and the interlayer insulating layer 10 have a contact hole CHg that exposes a part of the lower connection section 3g in a region that does not overlap the upper connection section 6g and a part of the upper connection section 6g. The connection electrode 8g is disposed on the interlayer insulating layer 10 and in the contact hole CHg, and is in contact with the exposed portion of the upper connection section 6g and the exposed portion of the lower connection section 3g in the contact hole CHg. In this manner, the upper connection section 6g and the lower connection section 3g are electrically connected to each other via the connection electrode 8g.

Note that a structure and an arrangement of the gate connection section GC are not limited to the illustrated example. The upper connection section 6g may be in direct contact with the lower connection section 3g.

Manufacturing Method of TFT 101

Next, an example of a manufacturing method of the TFT 101 will be described with reference to FIGS. 4A to 4F.

Figure 4A:
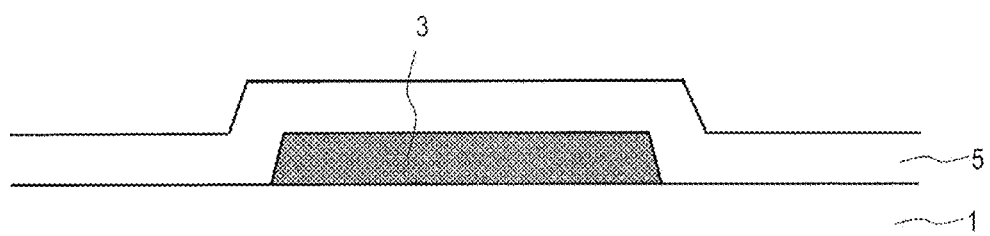
FIG. 4A is a process cross-sectional view illustrating an example of a manufacturing method of the TFT 101.

As illustrated in FIG. 4A, a lower metal layer including the lower electrode 3 is formed on the substrate 1, and the lower insulating layer 5 that covers the lower electrode 3 is then formed.

Specifically, first, a not-illustrated lower conductive film (having a thickness of, for example, equal to or more than 50 nm and equal to or less than 500 nm) is formed on the substrate (for example, a glass substrate) 1 by sputtering or the like. Next, the lower conductive film is patterned by a known photolithography process to obtain a lower metal layer including the lower electrode 3. The lower metal layer may include, for example, the lower connection section 3g illustrated in FIG. 3.

A glass substrate, a silicon substrate, a plastic substrate (resin substrate) having heat resistance, or the like can be used as the substrate 1, for example.

A layered film having a Ti film (having a thickness of 30 nm) as a lower layer and having a Cu film (having a thickness of 300 nm) as an upper layer is used as the lower conductive film. Note that the material of the lower conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used.

Next, the lower insulating layer 5 is formed to cover the lower metal layer. The lower insulating layer 5 is formed by CVD or the like, for example. Here, the lower insulating layer 5 is disposed to cover the entire upper surface and the entire side surface of the lower electrode 3. As described above, the lower insulating layer 5 may be thicker than the gate insulating layer 9. The thickness of the lower insulating layer 5 may be, for example, equal to or greater than 150 nm and equal to or less than 550 nm. When the thickness is equal to or greater than 150 nm, a step of the oxide semiconductor layer 7 generated due to the lower electrode 3 can be more effectively reduced. When the thickness is equal to or less than 550 nm, particularly with the lower electrode 3 functioning as a lower gate, an ON current can be more effectively increased by reducing the thickness of the lower insulating layer 5 that becomes a lower gate insulating layer.

As the lower insulating layer 5, a silicon oxide ($SiO_2$) layer, a silicon nitride (SiNx) layer, a silicon oxynitride (SiOxNy; x>y) layer, a silicon nitride oxide (SiNxOy; x>y) layer, or the like may be used as appropriate. The lower insulating layer 5 may have a layered structure. For example, a silicon nitride layer, a silicon nitride oxide layer, or the like may be formed as a substrate-side layer (lower layer) in order to prevent diffusion of impurities and the like from the substrate 1, and a silicon oxide layer, a silicon oxynitride layer, or the like may be formed as a layer (upper layer) on top of the substrate-side layer in order to ensure insulating properties. Here, a layered film is used that includes an $SiO_2$ film having a thickness of 50 nm as the upper layer and an SiNx film having a thickness of 300 nm as the lower layer. In this way, when an insulating layer that contains oxygen (an oxide layer such as an $SiO_2$ layer, for example) is used as the uppermost layer of the lower insulating layer 5 (in other words, the layer that is in contact with the oxide semiconductor layer), in a case in which the oxygen deficiency occurs in the oxide semiconductor layer 7, since the oxygen deficiency can be recovered by the oxygen contained in the oxide layer, the oxygen deficiency of the oxide semiconductor layer 7 can be mitigated.

Figure 4B:
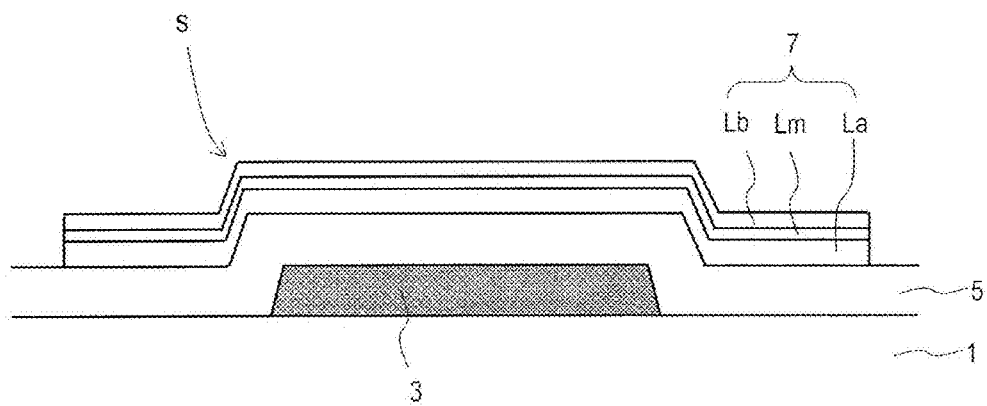
FIG. 4B is a process cross-sectional view illustrating an example of the manufacturing method of the TFT 101.

Next, as illustrated in FIG. 4B, the oxide semiconductor layer 7 having the layered structure is formed on the lower insulating layer 5.

Specifically, first, a lower oxide semiconductor film, a middle oxide semiconductor film, and an upper oxide semiconductor film is formed from the lower insulating layer 5 side by using sputtering to form a layered film. Each of the oxide semiconductor films has a composition and a thickness corresponding to the lower layer La, the high mobility layer Lm, and the upper layer Lb. Each of the oxide semiconductor films may be a crystalline oxide semiconductor film, or may be an amorphous oxide semiconductor film. Annealing process may be performed on the layered film of the oxide semiconductors. Here, heat treatment is performed at a temperature of equal to or higher than 200° C. and equal to or lower than 500° C. in an air atmosphere. The heat treatment time is, for example, equal to or longer than 30 minutes and equal to or less than 2 hours. Subsequently, the layered film is patterned. The patterning of the layered film may be performed by, for example, wet etching using a PAN-based etching solution containing phosphoric acid, nitric acid, and acetic acid, or an oxalic acid-based etching solution. In this manner, the oxide semiconductor layer 7 including the lower layer La, the high mobility layer Lm, and the upper layer Lb in this order from the lower insulating layer 5 side is obtained. The oxide semiconductor layer 7 extends across the lower electrode 3 when viewed from the normal direction of the substrate 1. As illustrated, the oxide semiconductor layer 7 may include the step s due to the edge of the lower electrode 3.

Figure 4C:
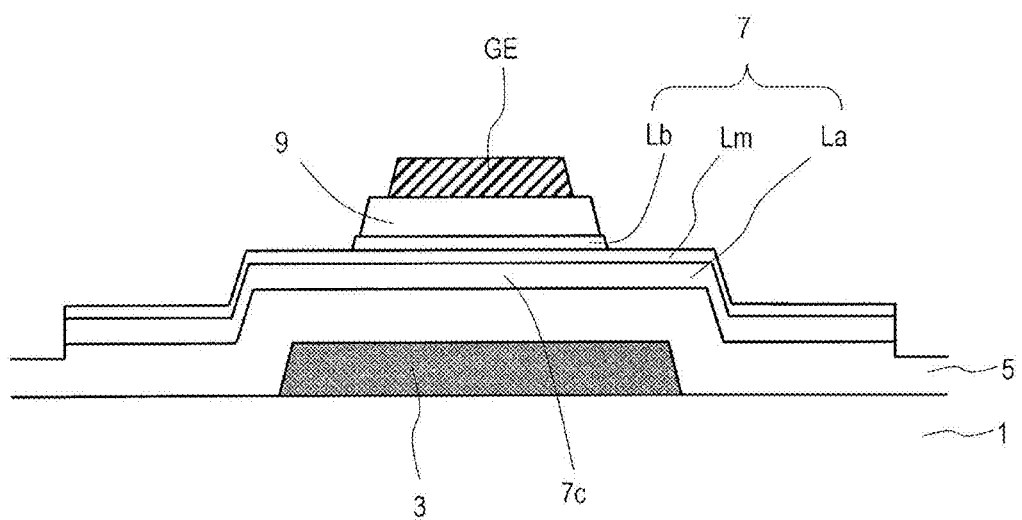
FIG. 4C is a process cross-sectional view illustrating an example of the manufacturing method of the TFT 101.

Next, as illustrated in FIG. 4C, the gate insulating layer 9 and the gate electrode GE are formed on a part of the oxide semiconductor layer 7.

First, a gate insulating film (not illustrated) and a gate conductive film (not illustrated) are formed in this order to cover the oxide semiconductor layer 7.

As the gate insulating film, an insulating film similar to the lower insulating layer 5 (the insulating film exemplified as the lower insulating layer 5) may be used. Here, as the gate insulating film, a silicon oxide ($SiO_2$) layer is formed by the CVD, for example. When an oxide film such as a silicon oxide film is used as the insulating film, oxidation defects generated in the channel region of the oxide semiconductor layer 7 can be reduced by the oxide film, and thus resistance lowering of the channel region can be suppressed. The thickness of the gate insulating film (i.e., the thickness of the gate insulating layer 9) may be, for example, equal to or greater than 80 nm and equal to or less than 250 nm, and preferably equal to or greater than 100 nm and equal to or less than 200 nm. By reducing the thickness of the gate insulating layer 9 (for example, to equal to or less than 200 nm), a decrease in ON current due to the upper layer Lb being disposed on the high mobility layer Lm can be compensated, and thus a high ON current can be maintained. When the thickness of the gate insulating layer 9 is equal to or greater than 100 nm, reliability can be improved.

As the gate conductive film, for example, a metal such as molybdenum (Mo), tungsten (W), aluminum (Al), copper (Cu), titanium (Ti) or tantalum (Ta), or an alloy thereof may be used. The gate conductive film may have a layered structure including a plurality of layers formed of different conductive materials. As the gate conductive film, a Cu/Ti layered film having a Ti film as a lower layer and a Cu film as an upper layer, or a Cu/Mo layered film having a Mo film as a lower layer and a Cu film as an upper layer may be used. The thickness of the gate conductive film is, for example, equal to or greater than 50 nm and equal to or less than 500 nm.

Next, the gate conductive film is patterned by a known photolithography process. Here, a resist layer is formed on the gate conductive film. Etching (for example, wet etching) of the gate conductive film is performed by using the resist layer as a mask. In this manner, a gate metal layer including the gate electrode GE of the TFT is obtained. The gate metal layer may include the upper connection section 6g illustrated in FIG. 3.

Subsequently, patterning of the gate insulating film is performed by using the resist layer described above as a mask or using the gate metal layer as a mask to form the gate insulating layer 9. According to the method, the side surface of the gate electrode GE and the side surface of the gate insulating layer 9 may be aligned with each other. As described above, a surface layer portion (for example, a part or all of the upper layer Lb) of the oxide semiconductor layer 7 may be overetched during patterning of the gate insulating layer 9. A surface layer portion of the high mobility layer Lm may also be overetched. An etching condition of the gate insulating layer 9 is not particularly limited, but an adjustment is made such that the high mobility layer Lm is not completely removed across a thickness direction.

Note that patterning of the gate insulating film and the gate conductive film may be performed separately. Specifically, prior to forming the gate conductive film, patterning of the gate insulating film is performed to form the gate insulating layer 9. Subsequently, the gate conductive film may be formed to cover the gate insulating layer 9, and the gate metal layer may be formed by patterning the gate conductive film. Alternatively, after film formation of the gate insulating film, the gate conductive film is film-formed, and patterning of the gate conductive film is performed. Then, the gate insulating layer 9 may be formed by patterning the gate insulating film.

Figure 4D:
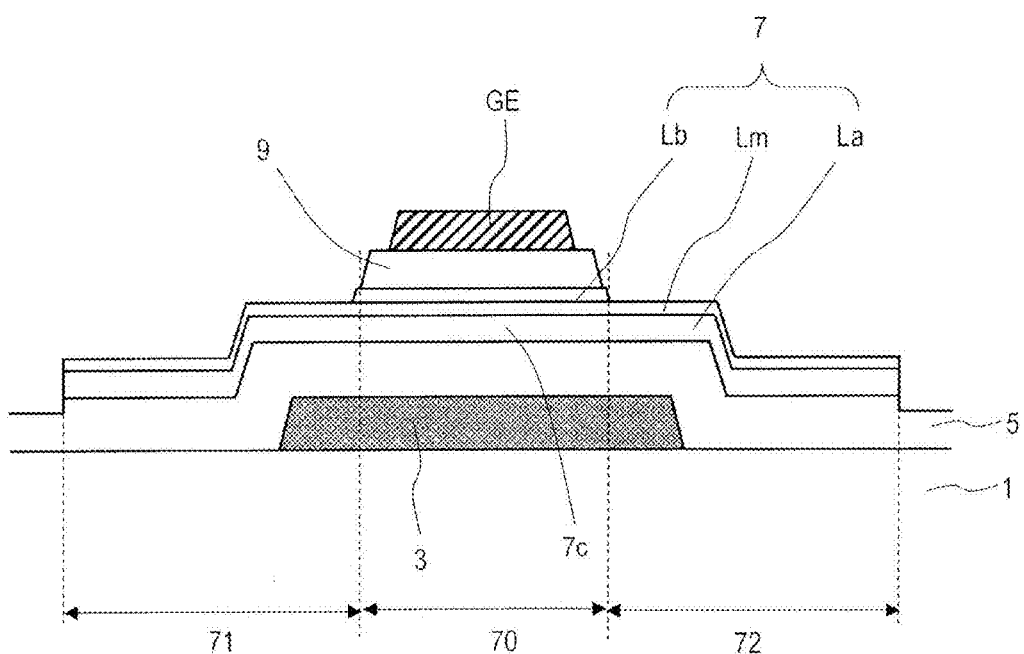
FIG. 4D is a process cross-sectional view illustrating an example of the manufacturing method of the TFT 101.

Subsequently, the resistance lowering processing of the oxide semiconductor layer 7 may be performed. Plasma processing may be performed as the resistance lowering processing, for example. In this manner, as illustrated in FIG. 4D, when viewed from the normal direction of the main surface of the substrate 1, regions of the oxide semiconductor layer 7 overlapping neither the gate electrode GE nor the gate insulating layer 9 (exposed regions) are low-resistive regions having a specific resistance lower than that of the region overlapping the gate electrode GE and the gate insulating layer 9 (here, the region that becomes the channel). The low-resistive region may be a conductive region (for example, sheet resistance equal to or less than 200 $\Omega/\square$). The region (high-resistive region) 70 of the oxide semiconductor layer 7 being left as a semiconductor region without being lowered in resistance includes the channel region 7c. The low-resistive region includes the first region 71 and the second region 72 located on the source side and the drain side of the channel region 7c.

Note that the resistance lowering processing (plasma processing) is not limited to the method described above. For example, the exposed region of the oxide semiconductor layer 7 may be lowered in resistance by using plasma containing reducing plasma or a doping element (for example, argon plasma). The method and conditions of resistance lowering processing are described in JP 2008-40343 A, for example. The entire contents of the disclosure of JP 2008-40343 A are incorporated herein by reference. Note that, instead of performing the resistance lowering processing, the exposed region of the oxide semiconductor layer 7 may be lowered in resistance by using the interlayer insulating layer 10.

Figure 4E:
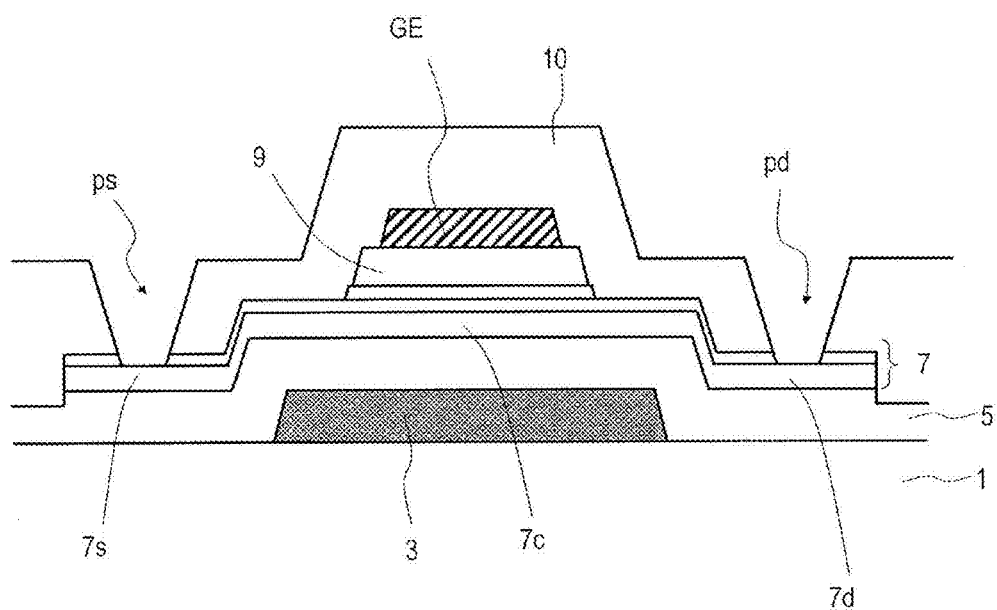
FIG. 4E is a process cross-sectional view illustrating an example of the manufacturing method of the TFT 101.

Subsequently, as illustrated in FIG. 4E, the interlayer insulating layer 10 that covers the oxide semiconductor layer 7, the gate insulating layer 9, and the gate metal layer is formed. Then, a resist layer is formed on the interlayer insulating layer 10, and the interlayer insulating layer 10 is patterned by using the resist layer as a mask. In this manner, the first opening ps that exposes a part of the first contact region 7s of the oxide semiconductor layer 7 and the second opening pd that exposes a part of the second contact region 7d are formed in the interlayer insulating layer 10.

Although not illustrated, in the region in which the gate connection section GC illustrated in FIG. 3 is formed, the interlayer insulating layer 10 and the lower insulating layer 5 may be patterned in the present patterning process, and the contact hole CHg that exposes a part of the lower connection section 3g may be formed. The lower insulating layer 5 may be etched by using the resist layer and the gate metal layer on the interlayer insulating layer 10 as masks. In this case, a part of the side surface of the lower insulating layer 5 may be aligned with the side surface of the interlayer insulating layer 10, and another part of the side surface of the lower insulating layer 5 may be aligned with the upper connection section 6g.

The interlayer insulating layer 10 can be formed with a single-layer or a multi-layer of an inorganic insulating layer such as a silicon oxide film, a silicon nitride film, a silicon oxynitride film, a silicon nitride oxide film and the like. The thickness of the inorganic insulating layer may be equal to or more than 100 nm and equal to or less than 500 nm. It is preferable to form the interlayer insulating layer 10 by using an insulating film that reduces an oxide semiconductor such as a silicon nitride film, because the specific resistance of the region of the oxide semiconductor layer 7 being in contact with the interlayer insulating layer 10 (here, the low-resistive region) can be maintained low. Here, an SiNx layer (having a thickness of 300 nm) is formed as the interlayer insulating layer 10 by the CVD.

When an insulating layer capable of reducing an oxide semiconductor (for example, a hydrogen donating layer such as a silicon nitride layer) is used as the interlayer insulating layer 10, even when the above-mentioned resistance lowering processing is not performed, the portion of the oxide semiconductor layer 7 being in contact with the interlayer insulating layer 10 can be further lowered in resistance compared to the portions that are not contact with the interlayer insulating layer 10.

Figure 4F:
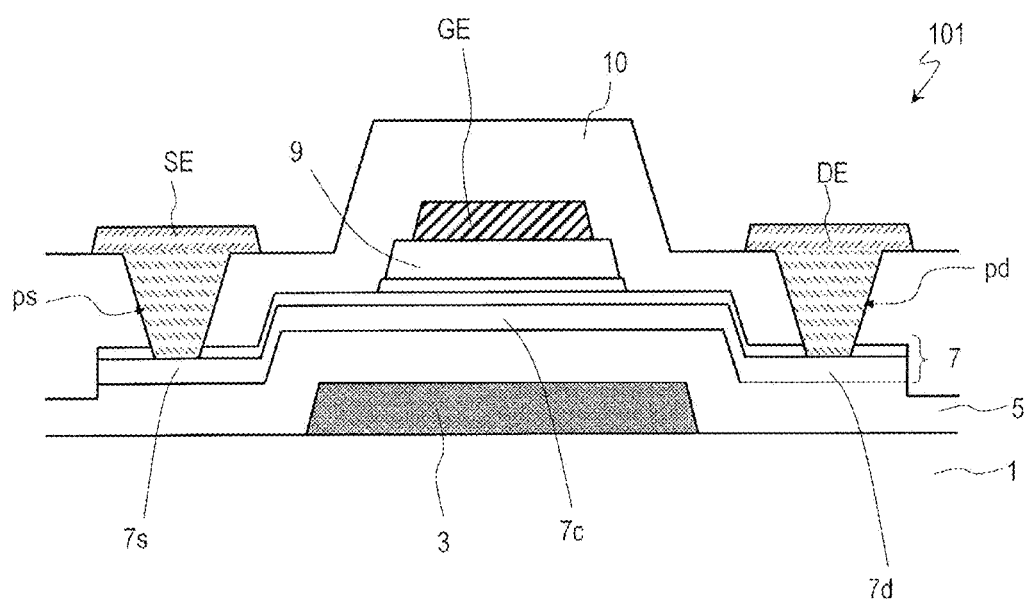
FIG. 4F is a process cross-sectional view illustrating an example of the manufacturing method of the TFT 101.

Subsequently, as illustrated in FIG. 4F, the source conductive film (having a thickness of, for example, equal to or more than 50 nm and equal to or less than 500 nm) (not illustrated) is formed on the interlayer insulating layer 10, and the source conductive film is patterned. In this manner, a source metal layer including the source electrode SE and the drain electrode DE is formed.

The source electrode SE is disposed on the interlayer insulating layer 10 and in the first opening ps, and is connected to the first contact region 7s of the oxide semiconductor layer 7 in the first opening ps. The drain electrode DE is disposed on the interlayer insulating layer 10 and in the second opening pd, and is connected to the second contact region 7d of the oxide semiconductor layer 7 in the second opening pd. In this manner, the TFT 101 is manufactured.

Although not illustrated, the connection electrode 8g may be formed by patterning the source conductive film in the region in which the gate connection section GC illustrated in FIG. 3 is formed. The connection electrode 8g is connected to the lower connection section 3g and the upper connection section 6g in the contact hole CHg.

As the source conductive film, an element selected from aluminum (Al), chromium (Cr), copper (Cu), tantalum (Ta), titanium (Ti), molybdenum (Mo), and tungsten (W), or an alloy containing these elements as components can be used. For example, a triple-layer structure of titanium film-aluminum film-titanium film, or a triple-layer structure of molybdenum film-aluminum film-molybdenum film can be used. Note that the source conductive film is not limited to the triple-layer structure, and may have a single-layer or a dual-layer structure, or a layered structure of four or more layers. Here, a layered film having a Ti film (having a thickness of from 15 to 70 nm) as a lower layer and having a Cu film (having a thickness of from 50 to 400 nm) as an upper layer is used. By using a layered film using an ohmic conductive film such as a Ti film as the bottom layer, a contact resistance of a source contact portion can be lowered more effectively.

Examples and Comparative Examples

In order to confirm the effect of the layered channel structure in the present embodiment, the present inventors prepared a plurality of measurement TFTs and evaluated TFT characteristics thereof.

Here, the plurality of measurement TFTs having different compositions and thicknesses of layers in an oxide semiconductor layer were used. The composition of each layer of the oxide semiconductor layer 7 in the measurement TFT is shown in Table 1.

TABLE 1

|  | (A) | (B) | (C) |
|---|---|---|---|
| UPPER LAYER | In—Ga—Zn—O (In:Ga:Zn = 1:1:1) | In—Ga—Zn—O (In:Ga:Zn = 4:2:4) | In—Ga—Zn—O (In:Ga:Zn = 1:1:1) |
| HIGH MOBILITY LAYER | In—Zn—O | In—Zn—O | In—Zn—O |
| LOWER LAYER | In—Ga—Zn—O (In:Ga:Zn = 1:1:1) | In—Ga—Zn—O (In:Ga:Zn = 4:2:4) | In—Ga—Zn—O (In:Ga:Zn = 4:2:4 |

(i) Relationship Between Thickness and TFT Characteristics of Upper Layer and Lower Layer TFT Mobility A relationship between a thickness ratio (tb/ta) and TFT mobility in the oxide semiconductor layer 7 was examined by using, as a measurement TFT (A) shown in Table 1, a plurality of transistors A1 to A9 having a fixed thickness tm of the high mobility layer and different thicknesses ta and tb of the lower layer and the upper layer. The measurement results of the thickness of each layer of the oxide semiconductor layer 7 of the transistors A1 to A9, the thickness ratio tb/ta, and the mobility are shown in Table 2.

TABLE 2

|  | A1 | A2 | A3 | A4 | A5 | A6 | A7 | A8 | A9 |
|---|---|---|---|---|---|---|---|---|---|
| THICKNESS tm OF HIGH MOBILITY LAYER [nm] | 7 | 7 | 7 | 7 | 7 | 7 | 7 | 7 | 7 |
| THICKNESS tb OF UPPER LAYER [nm] | 0 | 3 | 5 | 7 | 10 | 30 | 15 | 10 | 15 |
| THICKNESS ta OF LOWER LAYER [nm] | 30 | 30 | 30 | 30 | 30 | 10 | 20 | 25 | 30 |
| THICKNESS RATIO tb/ta [—] | 0.00 | 0.10 | 0.17 | 0.23 | 0.33 | 3.00 | 0.75 | 0.40 | 0.50 |
| TFT MOBILITY [cm$^2$/Vs] | 33.3 | 36.1 | 39.4 | 37.3 | 35.3 | 21 | 29.7 | 32.1 | 32 |
| TFT MOBILITY (NORMALIZED) [%] | 84.5 | 91.6 | 100.0 | 94.7 | 89.6 | 53.3 | 75.4 | 81.5 | 81.2 |
| ΔVth(+) [V] | 4.5 | 4 | 2.5 | 3.5 | 4 | 6 | 4.8 | 4.1 | 5 |
| ΔVth(+) (NORMALIZED) [%] | 75.0 | 66.7 | 41.7 | 58.3 | 66.7 | 100.0 | 80.0 | 68.3 | 83.3 |

Figure 5:
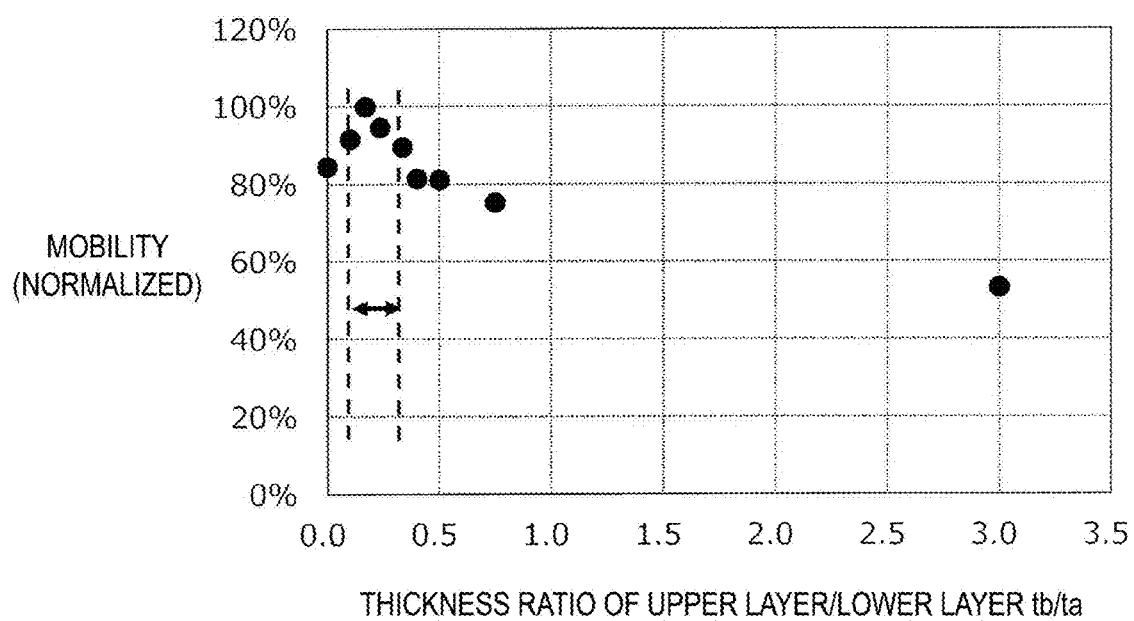
FIG. 5 is a diagram showing a relationship between a thickness ratio (tb/ta) and mobility in a measurement TFT.

FIG. 5 is a diagram showing a relationship between the thickness ratio (tb/ta) and the mobility in the transistors A1 to A9. The horizontal axis in FIG. 5 represents the ratio (tb/ta) of the thickness tb of the upper layer to the thickness to of the lower layer, and the vertical axis represents the mobility normalized by a maximum value.

As can be seen from the results shown in FIG. 5, the mobility can be further increased by providing the upper layer on the high mobility layer compared to when the upper layer is not provided (transistor A1). A conceivable reason for this is that the upper layer can reduce damage to the high mobility layer during film formation of the gate insulating film.

It is also clear that until the thickness ratio (tb/ta) reaches a predetermined value, TFT mobility increases with a thicker upper layer. In other words, TFT mobility decreases with a thinner upper layer. A conceivable reason for this is that, with a thin upper layer, a portion of the high mobility layer that becomes a low-resistive region is also etched during etching of the gate insulating film, and, as a result, resistance of the low-resistive region increases, and mobility as the TFT decreases. The thickness to of the upper layer may be set such that the thickness ratio (tb/ta) is, for example, equal to or more than 1/10. Alternatively, the thickness tb of the upper layer may be equal to or greater than 2 nm, for example, equal to or greater than 3 nm. In this manner, it is clear that higher mobility than that of the transistor A1 not including the upper layer can be obtained.

On the other hand, when the thickness ratio (tb/ta) exceeds a predetermined value (around 0.17), it is clear that TFT mobility decreases with a thicker upper layer. When the thickness tb of the upper layer is relatively large, since the electrical field due to the gate electrode GE is mainly applied to the upper layer when the potential of the gate electrode GE is at a high level, an electrical field applied to the high mobility layer becomes weak and a carrier accumulated in the high mobility layer decreases. A conceivable reason for this result is that the upper layer mainly functions as a channel (that is, electrons flow through the upper layer), and thus mobility as the TFT decreases. The thickness ratio (tb/ta) is preferably equal to or less than 1/3 in order to suppress a decrease in the mobility due to the upper layer by more reliably causing the high mobility layer to function as the channel. Alternatively, the thickness tb is preferably equal to or less than 12 nm, for example, equal to or less than 10 nm.

Note that, when the lower layer is made thin (for example, the transistor A6), when the potential of the lower electrode 3 serving as the lower gate is at the high level, the electric field due to the lower electrode 3 may be mainly applied to the high mobility layer, and the channel may be formed in the high mobility layer. However, since the thickness of the lower gate insulating layer (lower insulating layer 5) between the lower electrode 3 and the oxide semiconductor layer 7 is greater than the thickness of the upper gate insulating layer 9 between the oxide semiconductor layer 7 and the gate electrode GE, the effect of increasing the mobility as the TFT is smaller than when the upper layer is made thin. For example, when the transistors A5 and A6 are compared, it is clear that the transistor A5 including a thinner upper layer has mobility higher than that of the transistor A6 including a thinner lower layer. Therefore, in order to increase the mobility while ensuring the thickness of the entire oxide semiconductor layer 7, making the upper layer thin is more effective ((1), i.e., tb<ta).

Positive Shift of Threshold Voltage Due to PBT Stress

Next, a PBT stress (positive bias temperature stress) test was performed on the transistors A1 to A9, and a change amount (positive shift amount) ΔVth(+) in a positive direction of a threshold voltage Vth due to the PBT stress was measured. The measurement results of the mobility and ΔVth(+) are shown in Table 2. ΔVth(+) is a difference between an initial threshold voltage of the stress test and a threshold voltage after the PBT stress is applied for 2000 seconds. For example, ΔVth(+) tends to increase with greater damage (greater defects) to the oxide semiconductor layer that becomes the channel.

Figure 6A:
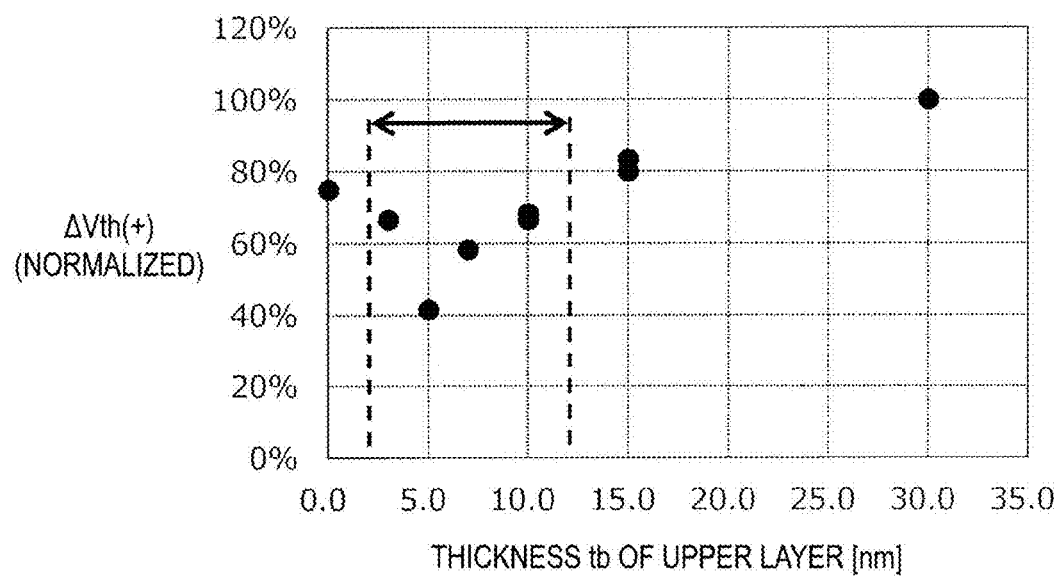
FIG. 6A is a diagram showing a relationship between a thickness tb of an upper layer and a positive shift amount $\Delta Vth(+)$ of a threshold voltage in the measurement TFT.
Figure 6B:
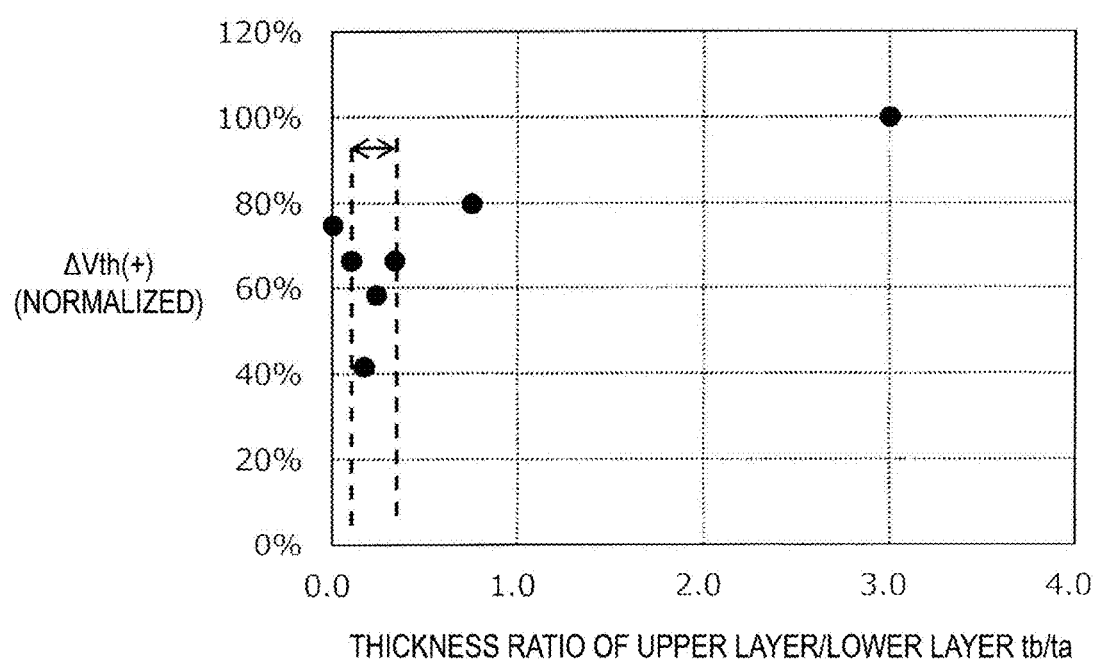
FIG. 6B is a diagram showing a relationship between a thickness ratio (tm/ta) and the positive shift amount $\Delta Vth(+)$ of the threshold voltage in the measurement TFT.

FIG. 6A is a diagram showing a relationship between the thickness tb of the upper layer and the positive shift amount ΔVth(+) of the threshold voltage in the transistors A1 to A9. FIG. 6B is a diagram showing a relationship between a thickness ratio (tm/ta) and the positive shift amount ΔVth(+) of the threshold voltage in the measurement TFT. The vertical axis in FIG. 6 represents ΔVth(+) normalized by a maximum value.

As clear from the results illustrated in FIGS. 6A and 6B, ΔVth can be further reduced by providing the upper layer on the high mobility layer than that when the upper layer is not provided (transistor A1). A conceivable reason for this is that the upper layer may reduce damage to the high mobility layer during film formation of the gate insulating film.

Further, it is clear that, until the thickness tb of the upper layer reaches a predetermined thickness, the positive shift amount ΔVth(+) of the threshold voltage Vth due to the PBT stress can be reduced with a thicker upper layer. In other words, ΔVth(+) increases with a thinner upper layer. A conceivable reason for this is that, with a thinner upper layer, the high mobility layer is damaged during etching of the gate insulating film, and a defect occurring in the high mobility layer increases, and, as a result, a threshold voltage shift (ΔVth(+)) due to the PBT stress increases. The thickness tb of the upper layer may be equal to or more than 2 nm (equal to or more than 3 nm in this example). Alternatively, the ratio (tb/ta) of the thickness tb of the upper layer to the thickness to of the lower layer may be equal to or more than 1/10. In this manner, damage to the high mobility layer can be more reliably suppressed by the upper layer, and the threshold voltage shift can be further suppressed than that of the transistor A1.

On the other hand, it is clear that, when the thickness tb of the upper layer exceeds a predetermined thickness (around 5 nm), the positive shift amount ΔVth(+) of the threshold voltage Vth due to the PBT stress increases with a thicker upper layer. The reason is that with a thicker upper layer, the electrical field of the gate electrode GE is mainly applied to the upper layer, and the upper layer mainly functions as the channel. A conceivable reason is that, since the upper layer is damaged during formation of the oxide semiconductor layer 7, the positive shift amount ΔVth(+) of the threshold voltage increases by the PBT stress. In order to more reliably cause the high mobility layer having relatively fewer defects to function as the channel, the thickness tb of the upper layer is preferably equal to or less than 12 nm (for example, equal to or less than 10 nm). Alternatively, the thickness ratio (tb/ta) is preferably equal to or less than 1/3.

(ii) Relationship Between Thickness and TFT Characteristics of Lower Layer and High Mobility Layer Threshold Voltage Shift Due to Light Degradation As the measurement TFT (A) shown in Table 1, a plurality of transistors A10 to A15 having a fixed thickness tb of the upper layer and different thicknesses tm and to of the high mobility layer and the lower layer were used. The thickness of each layer of the oxide semiconductor layer 7 of the transistors A10 to A15 and the thickness ratio tm/ta are shown in Table 3.

TABLE 3

|  | A10 | A11 | A12 | A13 | A14 | A15 |
|---|---|---|---|---|---|---|
| THICKNESS tb OF UPPER LAYER [nm] | 5 | 5 | 5 | 5 | 5 | 5 |
| THICKNESS tm OF HIGH MOBILITY LAYER [nm] | 3 | 5 | 7 | 10 | 15 | 30 |
| THICKNESS ta OF LOWER LAYER [nm] | 30 | 30 | 30 | 30 | 20 | 30 |
| THICKNESS RATIO tm/ta [—] | 0.10 | 0.17 | 0.23 | 0.33 | 0.75 | 1.00 |
| TFT MOBILITY [cm$^2$/Vs] | 28 | 36.9 | 39.4 | 39.5 | 29.7 | 31.3 |
| TFT MOBILITY (NORMALIZED) [%] | 70.9 | 93.4 | 99.7 | 100.0 | 75.2 | 79.2 |
| ΔVth(−) [V] | 0.13 | 0.47 | 0.68 | 0.98 | 1.29 | 2.13 |
| ΔVth(−) (NORMALIZED) [%] | 6.1 | 22.1 | 31.9 | 46.0 | 60.6 | 100.0 |

In the oxide semiconductor TFT, when light (for example, backlight light) is incident on the oxide semiconductor layer, there arises a problem that oxygen deficiency in the oxide semiconductor increases and the threshold voltage is shifted in a negative direction (negative shift). When a negative shift of the threshold voltage occurs, an off-leak current may increase or a depletion phenomenon (normally on state) may occur. Thus, a change in the threshold voltage due to the light degradation of each TFT was examined. Specifically, for each of the transistors A10 to A15, a difference (negative shift amount) ΔVth(−) between the threshold voltage Vth measured in a state where the backlight light is not applied and the threshold voltage Vth measured in a state where the backlight light is applied was measured.

The measurement results of ΔVth(−) of each of the transistors are shown in Table 3.

Figure 7A:
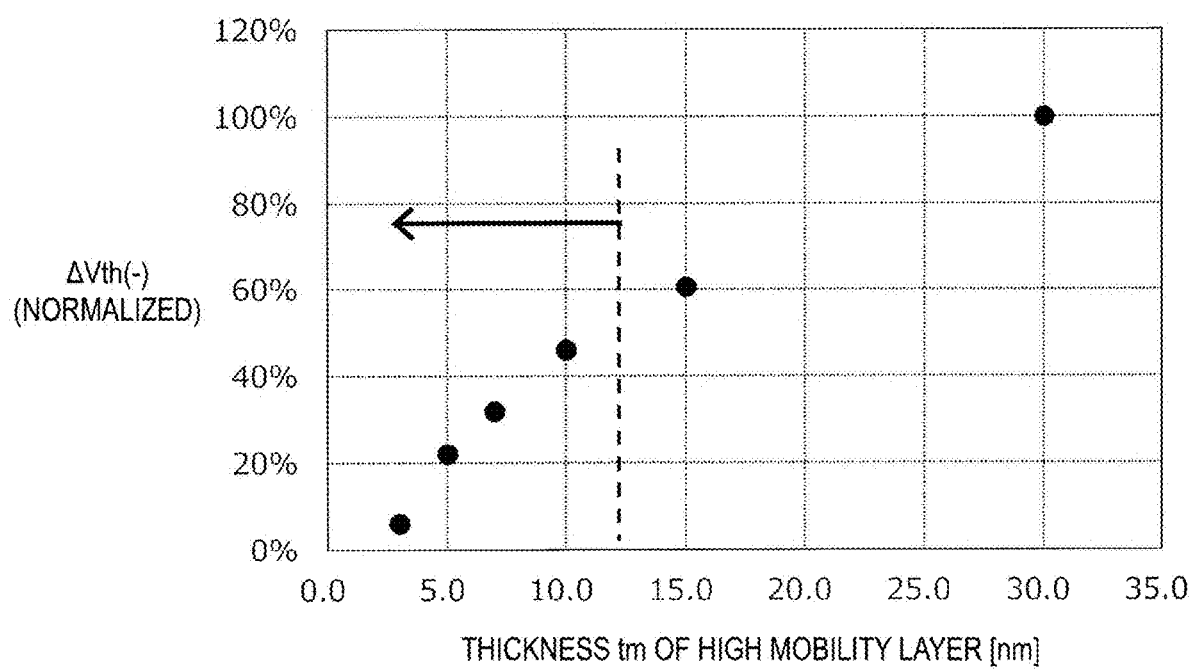
FIG. 7A is a diagram showing a relationship between a thickness tm of a high mobility layer and a negative shift amount ΔVth(−) of the threshold voltage in the measurement TFT.
Figure 7B:
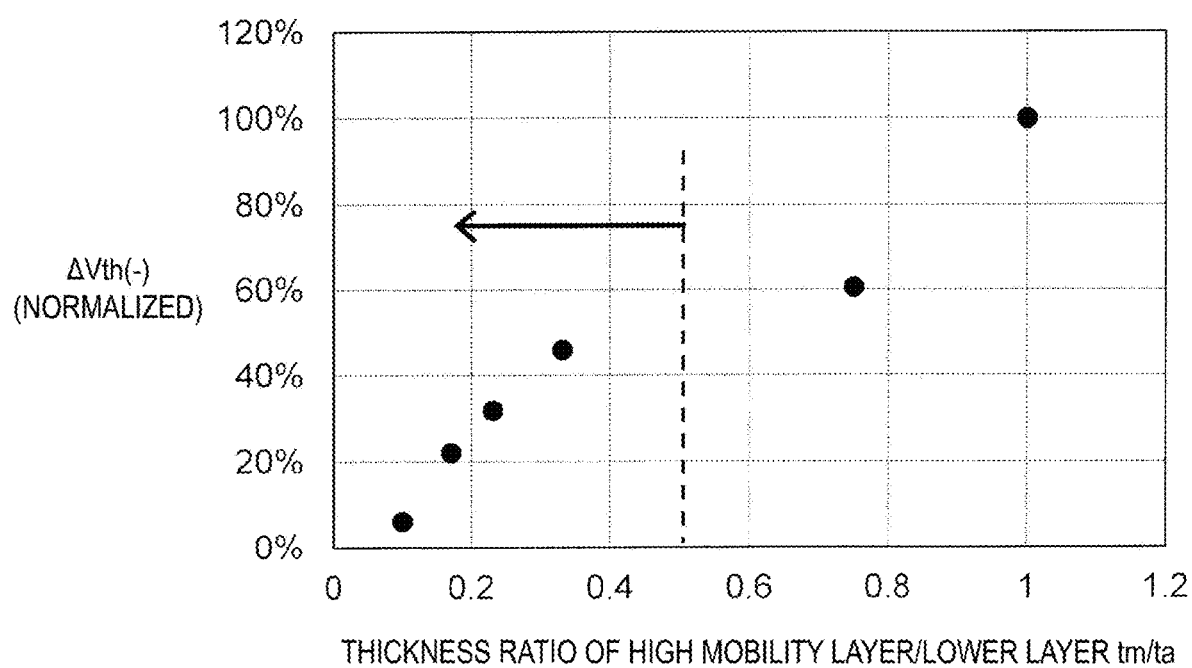
FIG. 7B is a diagram showing a relationship between the thickness ratio (tm/ta) and the negative shift amount ΔVth (−) of the threshold voltage in the measurement TFT.

FIG. 7A is a diagram showing a relationship between the thickness tm of the high mobility layer and ΔVth(−) in the transistors A10 to A15. FIG. 7B is a diagram showing a relationship between the thickness ratio (tm/ta) and ΔVth(−) in the transistors A10 to A15. The vertical axis in FIGS. 7A and 7B represents ΔVth(−) normalized by a maximum value.

As can be seen from FIG. 7A, the negative shift amount ΔVth(−) of the threshold voltage increases with a thicker high mobility layer. A conceivable reason for this is that, since a high mobility material generally reacts greatly to light, degradation due to light increases with a thicker high mobility layer. The thickness tm of the high mobility layer is preferably equal to or less than 12 nm (for example, equal to or less than 10 nm). Alternatively, as can be seen from FIG. 7B, the ratio (tm/ta) of the thickness tm of the high mobility layer to the thickness to of the lower layer is preferably, for example, equal to or less than 1/2, and more preferably equal to or less than 1/3.

TFT Mobility

Next, the mobility of the transistors A10 to A15 was measured. The results are shown in Table 3.

Figure 8A:
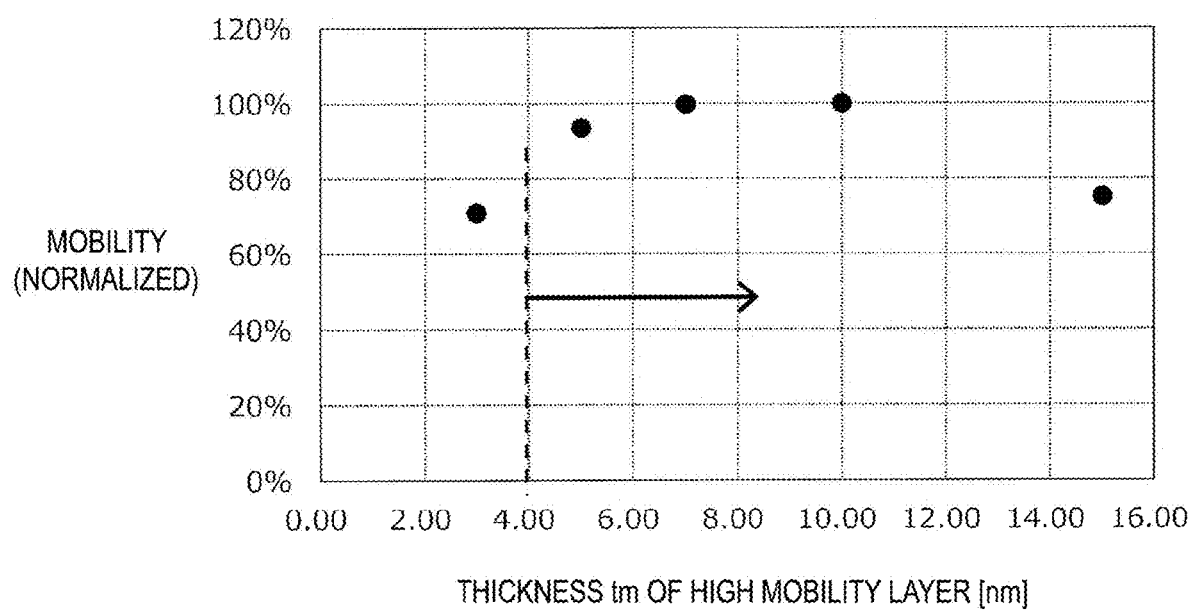
FIG. 8A is a diagram showing a relationship between the thickness tm of the high mobility layer and the mobility in the measurement TFT.
Figure 8B:
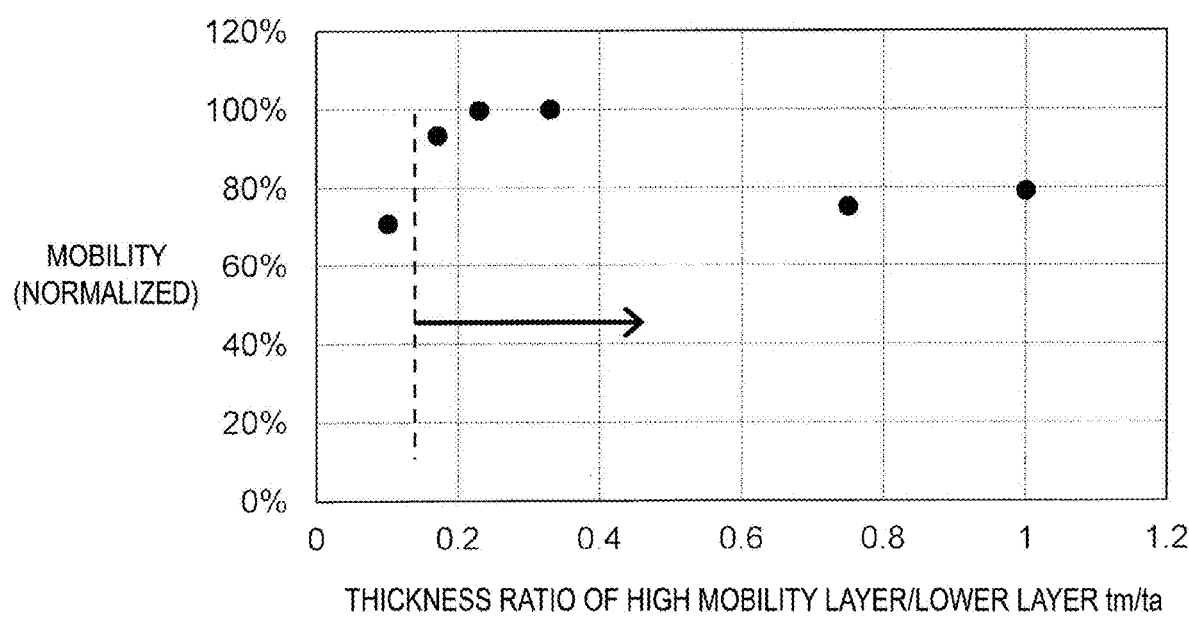
FIG. 8B is a diagram showing a relationship between the thickness ratio (tm/ta) and the mobility in the measurement TFT.

FIG. 8A is a diagram showing a relationship between the thickness tm of the high mobility layer and the TFT mobility in the transistors A10 to A15. FIG. 8B is a diagram showing a relationship between the thickness ratio (tm/ta) and the TFT mobility in the transistors A10 to A15. The horizontal axis in FIG. 8A represents the thickness tm of the high mobility layer and the horizontal axis in FIG. 8B represents the thickness ratio (tm/ta), and the vertical axis in FIGS. 8A and 8B represents the mobility normalized by a maximum value.

As can be seen from FIG. 8A, mobility decreases when the high mobility layer is too thin. A conceivable reason for this is that a current path becomes smaller with a thinner high mobility layer. In order to ensure the current path, the thickness tm of the high mobility layer is preferably equal to or more than 4 nm (for example, equal to or greater than 5 nm). Alternatively, as can be seen from FIG. 8B, the ratio (tm/ta) of the thickness tm of the high mobility layer to the thickness ta of the lower layer is preferably, for example, equal to or greater than 1/7.

(iii) Relationship Between Thickness and TFT Characteristics of Upper Layer and High Mobility Layer The TFT mobility was examined by using, as the measurement TFT (A) shown in Table 1, a plurality of transistors A16 to A25 having a fixed thickness ta of the lower layer and different thicknesses tm and tb of the high mobility layer and the upper layer. The measurement results of the thickness of each layer of the oxide semiconductor layer 7 of the transistors A16 to A25, a thickness ratio tb/tm, and the mobility are shown in Table 4.

TABLE 4

|  | A16 | A17 | A18 | A19 | A20 | A21 | A22 | A23 | A24 | A25 |
|---|---|---|---|---|---|---|---|---|---|---|
| THICKNESS tb OF UPPER LAYER [nm] | 0 | 3 | 5 | 7 | 10 | 15 | 5 | 5 | 15 | 5 |
| THICKNESS tm OF HIGH MOBILITY LAYER [nm] | 7 | 7 | 7 | 7 | 7 | 7 | 7 | 10 | 7 | 30 |
| THICKNESS ta OF LOWER LAYER [nm] | 30 | 30 | 30 | 30 | 30 | 30 | 30 | 30 | 30 | 30 |
| THICKNESS RATIO tb/tm [—] | 0.00 | 0.43 | 0.71 | 1.00 | 1.43 | 2.14 | 0.71 | 0.50 | 2.14 | 0.17 |
| TFT MOBILITY [cm$^2$/Vs] | 33.3 | 36.1 | 39.4 | 37.3 | 35.3 | 32 | 39.4 | 39.5 | 32 | 31.3 |
| TFT MOBILITY (NORMALIZED) [%] | 84.5 | 91.6 | 100.0 | 94.7 | 89.6 | 81.2 | 100.0 | 100.3 | 81.2 | 79.4 |

Figure 9:
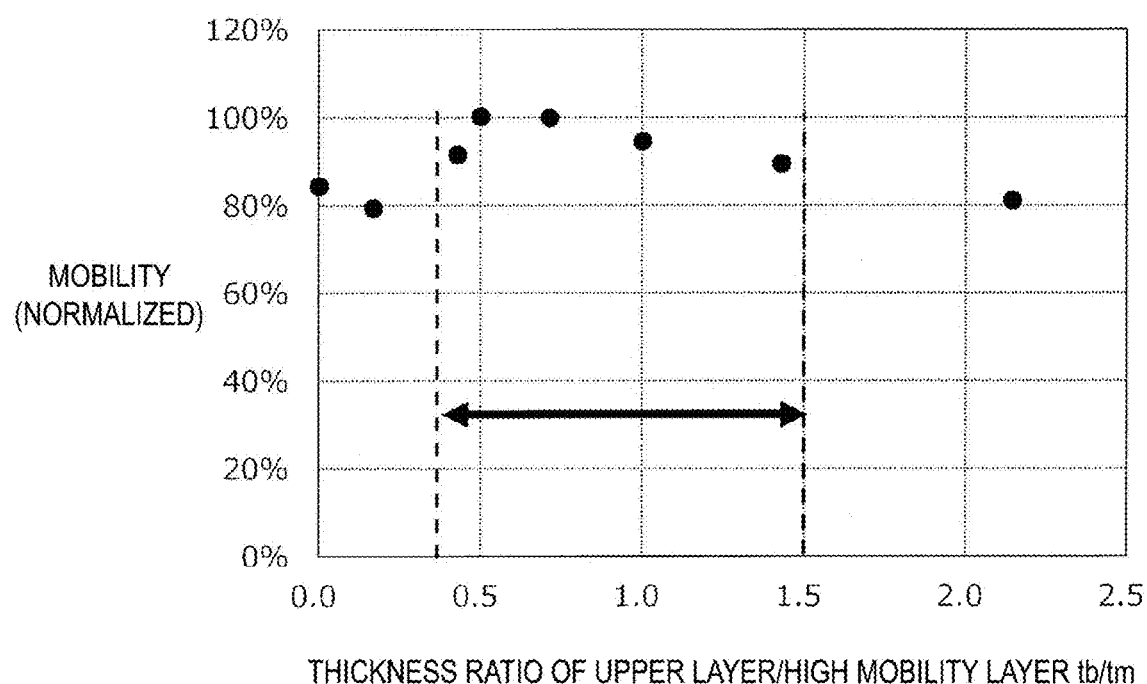
FIG. 9 is a diagram showing a relationship between a thickness ratio (tb/tm) and the mobility in the measurement TFT.

FIG. 9 is a diagram showing a relationship between the thickness ratio (tb/tm) and the mobility in the transistors A16 to A25. The horizontal axis in FIG. 9 represents the ratio (tb/tm) of the thickness tb of the upper layer to the thickness tm of the high mobility layer, and the vertical axis represents the mobility normalized with the mobility of the transistor A18 as 1.

As can be seen from FIG. 9, there is a possibility that when the upper layer is too thin for the high mobility layer, mobility as the TFT decreases. As described above, a conceivable reason for this is that the surface layer portion of not only the upper layer but also the high mobility layer is etched during formation of the oxide semiconductor layer 7, and, as a result, resistance in the low-resistive region of the oxide semiconductor layer 7 increases. In order to more effectively suppress a decrease in mobility due to etching of the high mobility layer, the thickness ratio (tb/tm) is preferably equal to or greater than 2/5.

On the other hand, it is clear that mobility also decreases when the upper layer is too thick for the high mobility layer. A conceivable reason for this is that the electrical field due to the gate electrode GE when the potential of the gate electrode GE is at the high level is mainly applied to the upper layer, and the upper layer functions as the channel. In order to more reliably cause the high mobility layer to function as the channel, the thickness ratio tb/tm is preferably equal to or less than 3/2.

Note that the relationship between the thickness of each layer of the oxide semiconductor layer 7 and the TFT characteristics has been described above by taking, as an example, the measurement results for the measurement TFT (A) shown in Table 1. However, the TFT characteristics were also evaluated by changing the thickness of each layer for measurement TFTs (B) and (C), the trend similar to that of the measurement TFT (A) was confirmed. Note that the composition of each layer of the oxide semiconductor layer 7 is not limited to the composition shown in Table 1. For example, an In—Ga—Zn—O based semiconductor layer (for example, In:Ga:Zn=1:3:2, 1:3:6, and the like) having an In ratio smaller than 1/3 may be used as the lower layer and the upper layer, and an oxide semiconductor layer including In and Sn, such as an In—Ga—Zn—Sn—O based semiconductor layer, an In—Ga—Sn—O based semiconductor layer, an In—Sn—Zn—O based semiconductor layer, may be used as the high mobility layer.

Structure of Active Matrix Substrate

The TFT 101 in the present embodiment can be applied to various semiconductor devices. The TFT 101 may be applied to, for example, an active matrix substrate.

Hereinafter, a structure of a device according to the present embodiment will be described by taking an active matrix substrate 1000 as an example with reference to the drawings. The active matrix substrate according to the present embodiment is used for a display device such as a liquid crystal display device and an organic EL device, for example.

Figure 10:
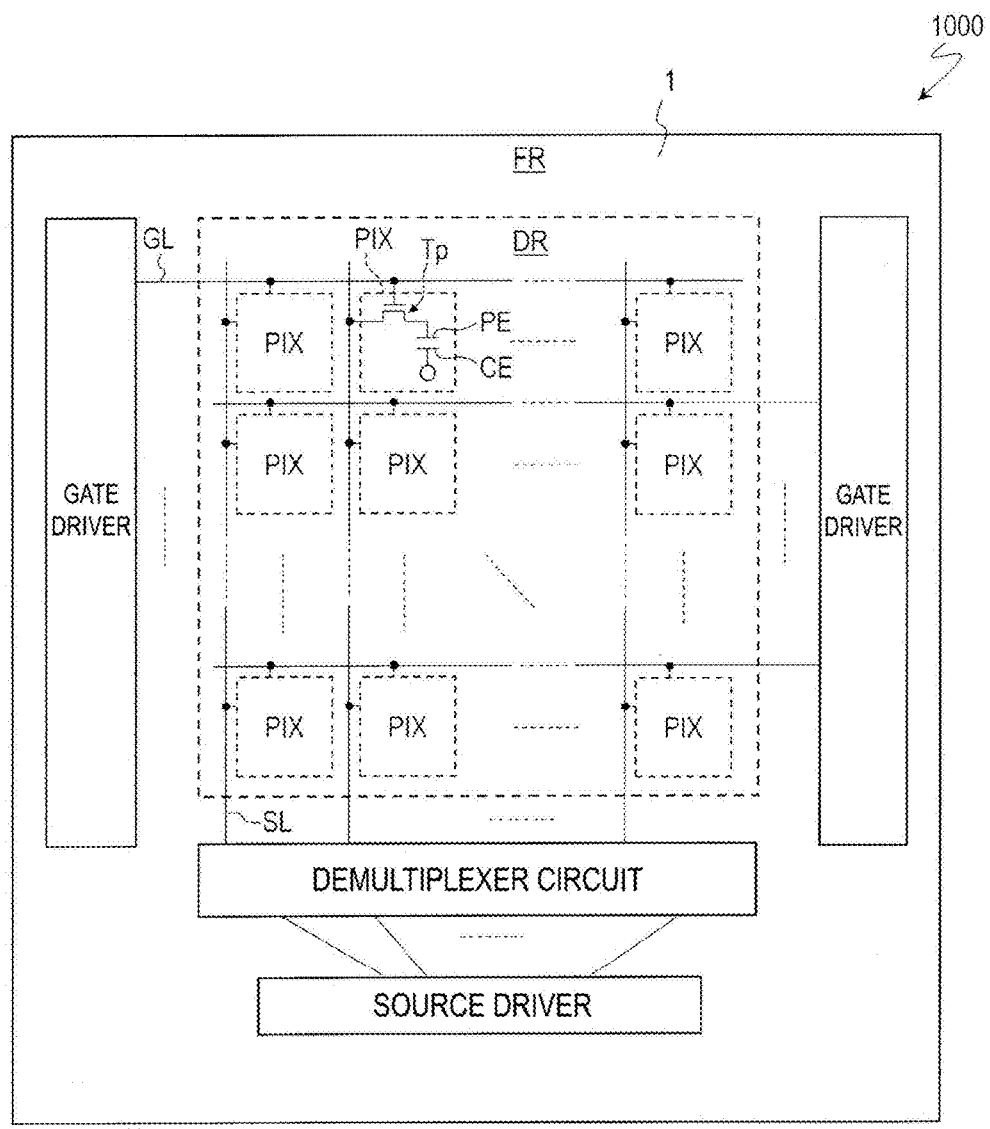
FIG. 10 is a schematic view illustrating an example of a planar structure of an active matrix substrate 1000.

FIG. 10 is a schematic view illustrating an example of a planar structure of the active matrix substrate 1000 according to the present embodiment.

The active matrix substrate 1000 has a display region DR, and a region (a non-display region or a frame region) FR other than the display region DR. The display region DR is constituted of a plurality of pixel areas PIX arranged in a matrix shape. Each of the plurality of pixel areas PIX (also simply referred to as a "pixel") is an area corresponding to a pixel of the display device. The non-display region FR is a region located in a periphery of the display region DR and does not contribute to display.

In the non-display region FR, for example, a gate driver, a demultiplexer circuit, and the like are monolithically provided on the substrate 1. A source driver is mounted on the active matrix substrate 1000, for example.

In the display region DR, a plurality of gate bus lines GL extending in a row direction (x direction), and a plurality of source bus lines SL extending in a column direction (y direction) are formed. Each of the plurality of pixel areas PIX is defined by the gate bus line GL and the source bus line SL, for example. The gate bus lines GL are connected to respective terminals of the gate driver. The source bus lines SL are connected to respective terminals of the source driver.

Each of the plurality of pixel areas PIX includes a thin film transistor Tp and a pixel electrode PE. The thin film transistor Tp is also referred to as a "pixel TFT". A gate electrode of the thin film transistor Tp is electrically connected to the corresponding gate bus line GL, and a source electrode of the thin film transistor Tp is electrically connected to the corresponding source bus line SL. A drain electrode of the thin film transistor Tp is electrically connected to the pixel electrode PE. When the active matrix substrate 1000 is applied to a display device in a transverse electrical field mode such as a fringe field switching (FFS) mode, although not illustrated, the active matrix substrate 1000 is provided with an electrode common to the plurality of pixels (common electrode).

A plurality of circuit TFTs configuring the peripheral circuits are formed in the non-display region of the active matrix substrate 1000. Each of the circuit TFTs includes a drive circuit TFT constituting the gate driver, a DMX circuit TFT constituting the demultiplexer circuit, and the like.

The TFT 101 illustrated in FIG. 1 may be used as the circuit TFT and/or the pixel TFT of the active matrix substrate 1000. Since the TFT 101 may have high mobility, it is advantageous to use the TFT 101 as the circuit TFT such as the drive circuit TFT and the DMX circuit TFT.

Second Embodiment

The present embodiment is different from the embodiment described above in that the present embodiment includes, on the same substrate, a first oxide semiconductor TFT and a second oxide semiconductor TFT including active layers different from each other. The active layer of the first oxide semiconductor TFT and the active layer of the second oxide semiconductor TFT are different layers from each other. The first oxide semiconductor TFT has a layered channel structure similar to that in the first embodiment. The second oxide semiconductor TFT includes, for example, an oxide semiconductor layer having mobility lower than that of the active layer of the first oxide semiconductor TFT.

A semiconductor device according to the present embodiment may be, for example, the active matrix substrate 1000 (FIG. 10). Hereinafter, description is given by taking the active matrix substrate 1000 as an example. However, the semiconductor device according to the present embodiment may include, on the same substrate, at least one first oxide semiconductor TFT and one second oxide semiconductor TFT, and is not limited to the active matrix substrate.

TFT Structure

Figure 11:
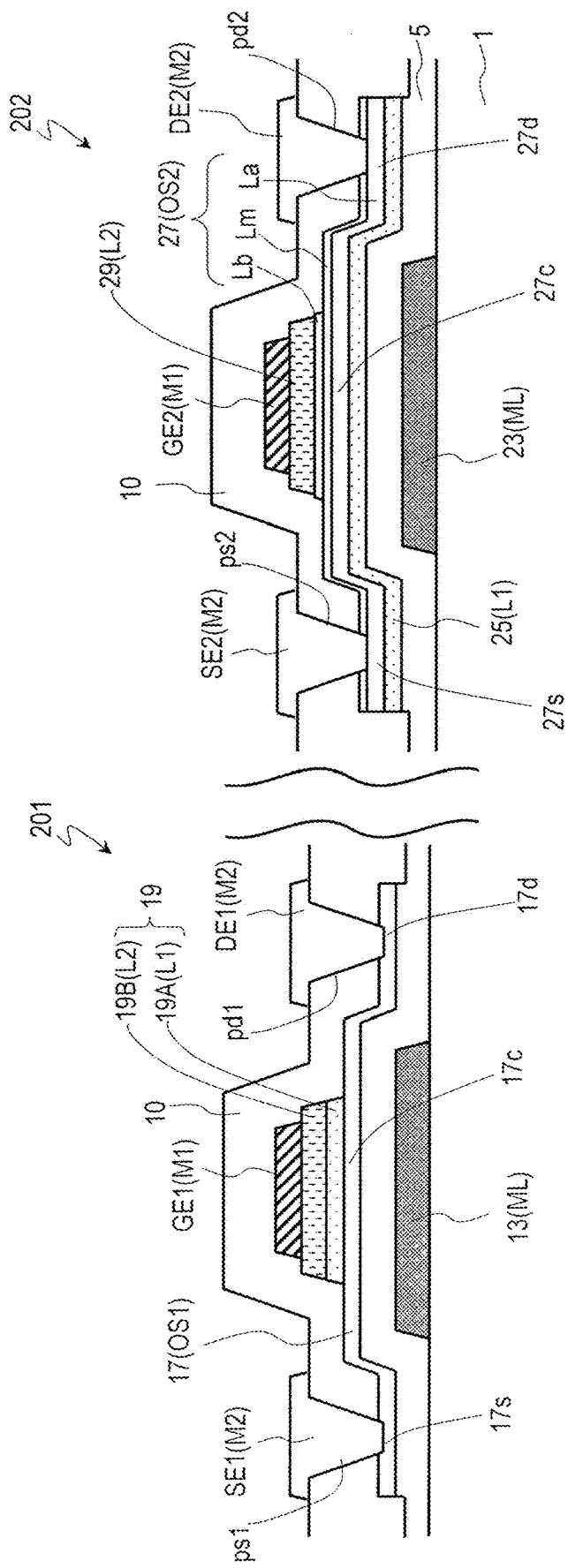
FIG. 11 is a cross-sectional view illustrating a TFT 201 and a TFT 202 according to a second embodiment.

FIG. 11 is a cross-sectional view illustrating a TFT 201 and a TFT 202 according to the present embodiment. The TFT 202 has a layered channel structure similar to that in the first embodiment. The TFT 202 may be a high mobility TFT, and the TFT 201 may be a low mobility TFT having mobility lower than that of the TFT 202. The TFT 201 may be a pixel TFT, and the TFT 202 may be a circuit TFT (for example, a drive circuit TFT). The active matrix substrate 1000 may include a plurality of TFTs 201 and a plurality of TFTs 202, but only a single TFT 201 and a single TFT 202 will be illustrated and described.

First, a layer structure of the active matrix substrate 1000 will be described. The active matrix substrate 1000 includes a lower metal layer ML, a lower insulating layer 5, a first oxide semiconductor film OS1, a first insulating film L1, a second oxide semiconductor film OS2, a second insulating film L2, a gate metal layer M1, an interlayer insulating layer 10, and a source metal layer M2 in this order from the substrate 1 side. Accordingly, the first oxide semiconductor film OS1 is located lower than the second oxide semiconductor film OS2.

The lower metal layer ML is a layer including electrodes, wiring lines, and the like formed of a lower conductive film, and includes, for example, light blocking layers of the respective TFTs. The gate metal layer M1 is a layer including electrodes, wiring lines, and the like formed of a gate conductive film, and includes, for example, the gate bus line GL, gate electrodes of the respective TFTs, and the like. The source metal layer M2 is a layer including electrodes, wiring lines, and the like formed of a source conductive film, and includes, for example, the source bus line SL, source and drain electrodes of the respective TFTs, and the like.

In the drawings, a reference sign for each constituent element may be followed by a sign indicating the metal layer, the insulating film, or the semiconductor film in parenthesis. For example, "(M1)" may be added after the reference sign of the electrode or wiring line formed in the gate metal layer M1.

The TFT 201 and the TFT 202 are each an oxide semiconductor TFT having a top gate structure, or a double gate structure respectively including a gate electrode above and below an active layer.

The TFT 201 includes an oxide semiconductor layer 17 formed of the first oxide semiconductor film OS1, a gate electrode GE1 disposed on a part of the oxide semiconductor layer 17 with a gate insulating layer 19 interposed therebetween, and a source electrode SE1 and a drain electrode DE1 that are electrically connected to the oxide semiconductor layer 17.

The gate insulating layer 19 has a layered structure including a lower layer 19A formed of the first insulating film L1 and an upper layer 19B formed of the second insulating film L2 disposed on the first insulating film L1. A side surface of the lower layer 19A and a side surface of the upper layer 19B may be aligned with each other. Here, a structure that "aligns side surfaces" of two layers includes a structure obtained when the two layers are etched using the same resist mask, or when one is used as a mask to etch another.

The oxide semiconductor layer 17 includes a channel region 17c covered by the gate electrode GE1 with the gate insulating layer 19 interposed therebetween, and a low-resistive region not covered by the gate electrode GE1 and the gate insulating layer 19 when viewed from a normal direction of the substrate 1. The low-resistive region is a region having a specific resistance lower than that of the channel region 17c, and includes a first region located on a source side of the channel region 17c and a second region located on a drain side. The low-resistive region can be formed by, for example, subjecting the oxide semiconductor layer 17 to resistance lowering processing using the gate electrode GE1 as a mask. The first region includes a first contact region 17s electrically connected to the source electrode SE1, and the second region includes a second contact region 17d electrically connected to the drain electrode DE1.

The gate insulating layer 19 may cover the channel region 17c, and may not cover the first contact region 17s and the second contact region 17d. In the illustrated example, the gate insulating layer 19 is formed only in a region overlapping the gate electrode GE1 when viewed from the normal direction of the substrate 1. A side surface of the gate insulating layer 19 and a side surface of the gate electrode GE1 may be aligned with each other.

When viewed from the normal direction of the substrate 1, the gate electrode GE1 is disposed on the gate insulating layer 19 to overlap the channel region 17c and not to overlap the first contact region 17s and the second contact region 17d.

The TFT 201 may include, on the substrate 1 side of the oxide semiconductor layer 17, a lower electrode 13 that functions as a light blocking layer. The lower electrode 13 is covered by the lower insulating layer 5. The oxide semiconductor layer 17 is disposed on the lower insulating layer 5. The lower electrode 13 may be disposed to overlap at least the channel region 17c of the oxide semiconductor layer 17 when viewed from the normal direction of the substrate 1. In this manner, deterioration of characteristics of the oxide semiconductor layer 17 caused by light (backlight light) from the substrate 1 side can be suppressed. The lower electrode 13 may be electrically in a floating state or may be fixed to the GND potential (0 V). Alternatively, the lower electrode 13 may function as a lower gate electrode by being electrically connected to the gate electrode GE1 by a non-illustrated gate connection section (see FIG. 3).

On the other hand, the TFT 202 includes an oxide semiconductor layer 27 formed of the second oxide semiconductor film OS2, a gate electrode GE2 disposed on a part of the oxide semiconductor layer 27 with a gate insulating layer 29 interposed therebetween, and a source electrode SE2 and a drain electrode DE2 that are electrically connected to the oxide semiconductor layer 27. The oxide semiconductor layer 27 has a layered structure similar to that of the oxide semiconductor layer 7 in the first embodiment. In other words, a lower layer La, a high mobility layer Lm, and an upper layer Lb are included in this order from the substrate 1 side. A composition, a thickness, and the like of each layer are similar to those of the oxide semiconductor layer 7 in the first embodiment.

The gate insulating layer 29 includes the second insulating film L2, but does not include the first insulating film L1. A side surface of the gate insulating layer 29 and a side surface of the gate electrode GE2 may be aligned with each other.

An insulating layer 25 is disposed between the oxide semiconductor layer 27 and the substrate 1. The insulating layer 25 is formed of the first insulating film L1. In other words, the insulating layer 25 is in the same layer as the lower layer 19A in the gate insulating layer 19 of the TFT 201. A side surface of the oxide semiconductor layer 27 and a side surface of the insulating layer 25 may be aligned with each other.

Similar to the oxide semiconductor layer 17, the oxide semiconductor layer 27 includes a channel region 27c covered by the gate electrode GE2 with the gate insulating layer 29 interposed therebetween, and a low-resistive region not covered by the gate electrode GE2 and the gate insulating layer 29 when viewed from the normal direction of the substrate 1. The low-resistive region is a region having a specific resistance lower than that of the channel region 27c, and includes a first region located on a source side of the channel region 27c and a second region located on a drain side. The low-resistive region can be formed by, for example, subjecting the oxide semiconductor layer 27 to the resistance lowering processing using the gate electrode GE2 as a mask. The first region includes a first contact region 27s electrically connected to the source electrode SE2, and the second region includes a second contact region 27d electrically connected to the drain electrode DE2.

The gate insulating layer 29 may cover the channel region 27c, and may not cover the first contact region 27s and the second contact region 27d. In the illustrated example, the gate insulating layer 29 is formed only in a region overlapping the gate electrode GE2 when viewed from the normal direction of the substrate 1. A side surface of the gate insulating layer 29 and a side surface of the gate electrode GE2 may be aligned with each other.

When viewed from the normal direction of the substrate 1, the gate electrode GE2 is disposed on the gate insulating layer 29 to overlap the channel region 27c and not to overlap the first contact region 27s and the second contact region 27d. The gate electrode GE2 is formed by, for example, using the same conductive film (gate conductive film) as the gate electrode GE1 of the TFT 201 (that is, in the gate metal layer M1).

Similarly to the TFT 201, the TFT 202 may include, on the substrate 1 side of the oxide semiconductor layer 27, a lower electrode 23 that functions as a light blocking layer. The lower electrode 23 is formed by, for example, using the same conductive film (lower conductive film) as the lower electrode 13 of the TFT 201 (that is, in the lower metal layer ML). The lower electrode 23 is covered by the lower insulating layer 5, and the insulating layer 25 and the oxide semiconductor layer 27 are disposed in this order on the lower insulating layer 5. The lower electrode 23 may be disposed to overlap at least the channel region 27c of the oxide semiconductor layer 27 when viewed from the normal direction of the substrate 1. The lower electrode 23 may be electrically in a floating state or may be fixed to the GND potential (0 V). Alternatively, the lower electrode 23 may function as a lower gate electrode by being electrically connected to the gate electrode GE2 (see FIG. 3).

The interlayer insulating layer 10 is disposed to cover the oxide semiconductor layer 17, the gate insulating layer 19, and the gate electrode GE1 of the TFT 201, and the oxide semiconductor layer 27, the gate insulating layer 29, and the gate electrode GE2 of the TFT 202. The interlayer insulating layer 10 may be in direct contact with the low-resistive region of the oxide semiconductor layer 17 and the low-resistive region of the oxide semiconductor layer 27.

The source electrode SE1 and the drain electrode DE1 of the TFT 201 and the source electrode SE2 and the drain electrode DE2 of the TFT 202 are disposed on the interlayer insulating layer 10, for example. These electrodes may be formed by using the same conductive film (source conductive film) (that is, in the source metal layer M2). In this example, first openings ps1 and ps2 that expose the first contact regions 17s and 27s of the oxide semiconductor layer 17 and the oxide semiconductor layer 27 and second openings pd1 and pd2 that expose the second contact regions 17d and 27d are provided in the interlayer insulating layer 10. The source electrode SE1 is connected to the first contact region 17s in the first opening ps1. The drain electrode DE1 is connected to the second contact region 17d in the second opening pd1. Similarly, the source electrode SE2 is connected to the first contact region 27s in the first opening ps2. The drain electrode DE2 is connected to the second contact region 27d in the second opening pd2.

Also in the present embodiment, the TFT 202 has the layered structure (FIG. 2) described above, and thus reliability can be improved while ensuring desired characteristics. In the present embodiment, the oxide semiconductor layer 27 is subjected to etching of the first insulating film L1 and the second insulating film L2, but the oxide semiconductor layer 27 has predetermined layered structure and thickness, and thus damage to the high mobility layer Lm is suppressed.

As described above, the electrodes, the insulating layers, and the semiconductor layers of the TFT 201 and the TFT 202 have the following relationships.

(II-1) The oxide semiconductor layer 17 and the oxide semiconductor layer 27 are formed of different oxide semiconductor films and are different layers from each other. The oxide semiconductor layer 27 has the layered structure including the lower layer La, the high mobility layer Lm, and the upper layer Lb. The oxide semiconductor layer 17 may be a single layer or may have a layered structure.

(II-2) The lower layer 19A of the gate insulating layer 19 and the insulating layer 25 are formed of the same insulating film (the first insulating film) L1 and are the same layer.

(II-3) The upper layer 19B of the gate insulating layer 19 and the gate insulating layer 29 are formed of the same insulating film (the second insulating film) L2 and are the same layer.

According to the present embodiment, it is possible to produce two types of TFTs having different mobilities and gate insulating layer thicknesses on the same substrate. Since the TFT 201 and the TFT 202 use the common conductive films and insulating films, the TFT 201 and the TFT 202 may be manufactured by a common process.

In the present embodiment, the oxide semiconductor layer 17, which is the active layer of the TFT 201, and the oxide semiconductor layer 27, which is the active layer of the TFT 202, are formed of different oxide semiconductor films. As a result, the mobility and thickness of each oxide semiconductor film can be controlled independently. Therefore, the threshold voltage of each TFT can be controlled according to the required characteristics. For example, the high mobility layer Lm of the TFT 202 may have mobility higher than that of the oxide semiconductor layer 17. In this manner, the TFT 202 may have TFT mobility higher than that of the TFT 201. The mobility of the lower layer La and the upper layer Lb may be higher or lower than that of the oxide semiconductor layer 17, or may be equal to that of the oxide semiconductor layer 17.

Further, according to the present embodiment, the thickness of the gate insulating layer 19 of the TFT 201 can be made greater than the thickness of the gate insulating layer 29 of the TFT 202. The thickness of the gate insulating layer 29 of the TFT 202 is determined by the thickness of the second insulating film L2, and the thickness of the gate insulating layer 19 of the TFT 201 is determined by the summed total thickness of the first insulating film L1 and the second insulating film L2. Therefore, the thickness of the gate insulating layer of each TFT can be independently controlled according to the required characteristics by the thicknesses of the first insulating film L1 and the second insulating film L2.

In the TFT 202, the gate insulating layer 29 can be made thin, so that the current driving force can be further increased. In addition, by thinning the gate insulating layer 29, the slope of the subthreshold characteristic can be steep (that is, the S value can be reduced), so that the switching characteristics can be improved. On the other hand, in the TFT 201, a high breakdown voltage (gate breakdown voltage) performance can be obtained by thickening the gate insulating layer 19. Also, the threshold voltage may be increased. As a result, the influence of foreign matters and the like can be reduced, which is effective for TFT disposed in a pixel that has a large area. Furthermore, since the S value becomes large, the TFT can be suitably used for, for example, a pixel circuit of an organic EL display device.

In a liquid crystal display device, the TFT 201 is suitably used as a pixel TFT because the off-leak current is small. Additionally, when the TFT 201 has the enhancement characteristics, the TFT 201 may be suitably used for some circuit TFTs such as a drive circuit TFT. As a result, circuit malfunction can be suppressed, thereby reducing yield loss. Furthermore, the TFT 201 may be used as an inspection TFT or an ESD protection TFT.

When the TFT 201 is used as the thin film transistor Tp (pixel TFT) illustrated in FIG. 1, the gate electrode GE1 is electrically connected to the corresponding gate bus line GL. The gate electrode GE1 and the corresponding gate bus line GL may be integrally formed in the gate metal layer M1 (that is, by using the gate conductive film). The source electrode SE1 is electrically connected to the corresponding source bus line SL. The source electrode SE1 and the corresponding source bus line SL may be integrally formed in the source metal layer M2 (that is, by using the source conductive film). The drain electrode DE1 is electrically connected to the corresponding pixel electrode PE.

The TFT 202 is suitably used for some circuit TFTs such as, for example, a DMX circuit TFT. The TFT 202 has mobility higher than that of the TFT 201, and has a superior current driving force (ON current). In addition, a channel can be shortened, thereby reducing a circuit area. Furthermore, in the TFT 202, the gate insulating layer 29 can be made thin, so that the S value can be made small. Therefore, the TFT 202 has excellent switching characteristics, whereby high-speed operation is possible.

As the drive circuit TFT, both of the TFT 201 and the TFT 202 may be included. For example, among the plurality of TFTs included in the gate drive circuit, at least a TFT referred to as an "output transistor" may be the TFT 202 having the high mobility, and the other TFTs may be the TFTs 201.

Manufacturing Method of TFT 201 and TFT 202

FIGS. 12A to 12G are process cross-sectional views for explaining a manufacturing method of the TFT 201 and the TFT 202 in the active matrix substrate 1000. In these figures, a TFT formation region R1 in which the TFT 201 is formed and a TFT formation region R2 in which the TFT 202 is formed are illustrated. Here, in an active matrix substrate applied to an FFS mode display device, a case in which the TFT 201 is used as a pixel TFT and the TFT 202 is used as a circuit TFT will be described as an example. Accordingly, the TFT formation region R1 is a part of each pixel area, and the TFT formation region R2 is a part of the non-display region. Further, in the following description, when a material, a thickness, and a formation method of each film and each layer are similar to those in the first embodiment, description thereof will be omitted.

Figure 12A:
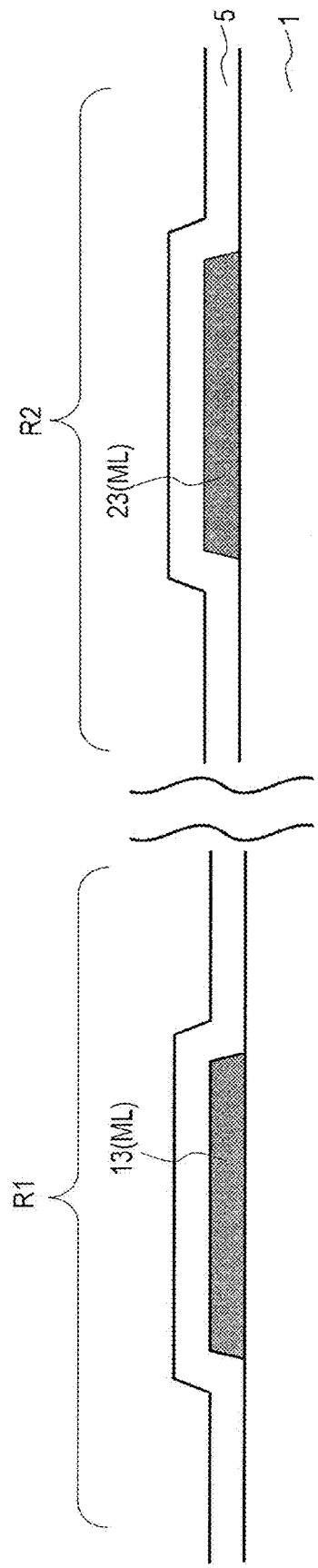
FIG. 12A is a process cross-sectional view illustrating an example of a manufacturing method of the TFT 201 and the TFT 202.

Formation of Lower Metal Layer ML (FIG. 12A)

A lower conductive film (having a thickness of, for example, equal to or more than 50 nm and equal to or less than 500 nm) is formed on the substrate 1 by, for example, sputtering. Next, the lower conductive film is patterned by a known photolithography process. In this manner, as illustrated in FIG. 12A, the lower electrode 13 and the lower electrode 23 of the TFTs are formed in the TFT formation region R1 and the TFT formation region R2, respectively. The material of the substrate 1 and the lower conductive film may be similar to those in the first embodiment.

Figure 12B:
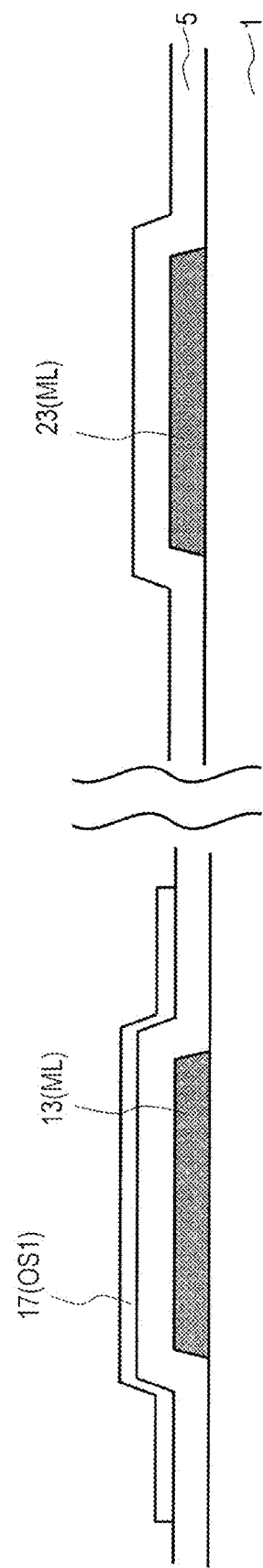
FIG. 12B is a process cross-sectional view illustrating an example of the manufacturing method of the TFT 201 and the TFT 202.

Formation of Lower Insulating Layer 5 and Oxide Semiconductor Layer 17 (FIG. 12B)

Subsequently, as illustrated in FIG. 12B, the lower insulating layer 5 (having a thickness of, for example, equal to or more than 200 nm and equal to or less than 600 nm) is formed to cover the lower electrode 13 and the lower electrode 23. Then, the oxide semiconductor layer 17 that becomes the active layer of the TFT 201 is formed in the TFT formation region R1.

The oxide semiconductor layer 17 may be formed by forming the first oxide semiconductor film OS1 on the lower insulating layer 5, and performing patterning. The first oxide semiconductor film OS1 may be formed by, for example, sputtering. Here, as the first oxide semiconductor film OS1, for example, an In—Ga—Zn—O based semiconductor film (In:Ga:Zn=1:1:1) is formed. Subsequently, the first oxide semiconductor film OS1 is patterned to obtain the oxide semiconductor layer 17. The first oxide semiconductor film OS1 is removed from the TFT formation region R2. The first oxide semiconductor film OS1 may be patterned with, for example, wet etching using a PAN-based etching solution containing phosphoric acid, nitric acid, and acetic acid, or an oxalic acid-based etching solution.

Figure 12C:
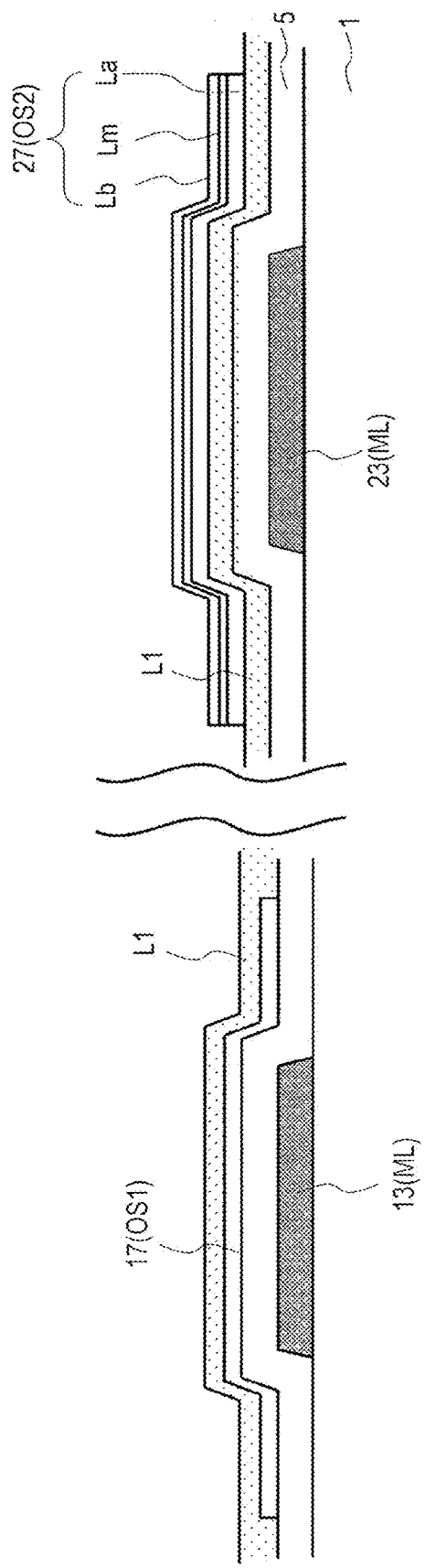
FIG. 12C is a process cross-sectional view illustrating an example of the manufacturing method of the TFT 201 and the TFT 202.

Formation of First Insulating Film L1 and Oxide Semiconductor Layer 27 (FIG. 12C)

Next, as illustrated in FIG. 12C, the first insulating film L1 is formed to cover the lower insulating layer 5 and the oxide semiconductor layer 17. Here, as the first insulating film L1, a silicon oxide film is formed by, for example, the CVD. Then, in the TFT formation region R1, the oxide semiconductor layer 27 that becomes the active layer of the TFT 202 is formed on the first insulating film L1.

The oxide semiconductor layer 27 may be formed by forming the second oxide semiconductor film OS2 on the first insulating film L1, and performing patterning. The second oxide semiconductor film OS2 may be formed by, for example, sputtering. The material, the formation method, and the patterning method of the second oxide semiconductor film OS2 are similar to those in the first embodiment. Here, an In—Ga—Zn—O based semiconductor film (In:Ga:Zn=1:1:1), an In—Zn—O based semiconductor film, and an In—Ga—Zn—O based semiconductor film (In:Ga:Zn=1:1:1) are layered in this order and patterned to form the layered semiconductor layer including the lower layer La, the high mobility layer Lm, and the upper layer Lb. For the patterning of the second oxide semiconductor film OS2, a PAN-based etching solution or an oxalic acid-based etching solution can be used.

Figure 12D:
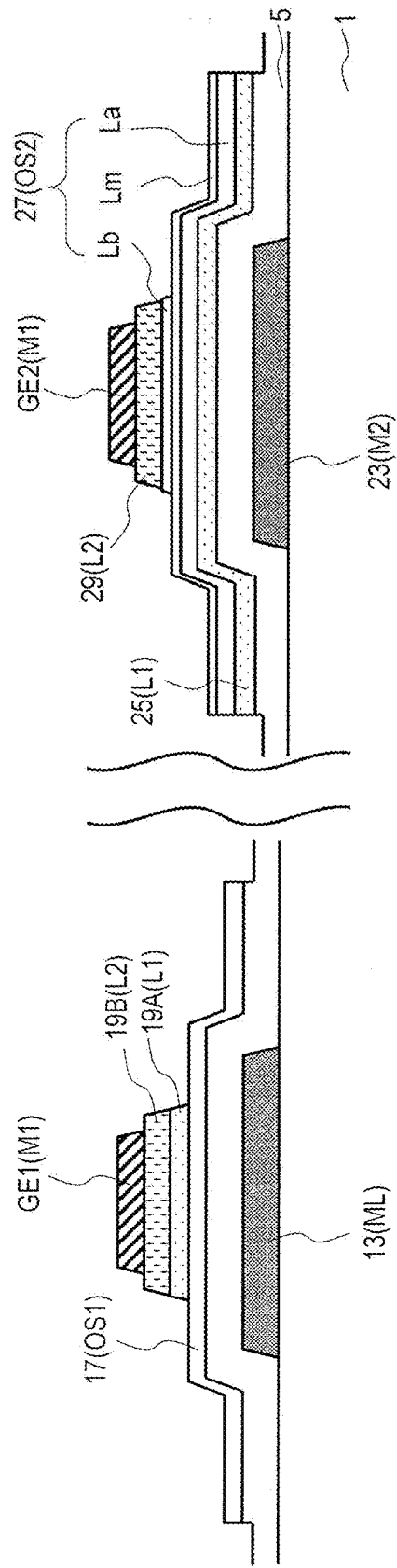
FIG. 12D is a process cross-sectional view illustrating an example of the manufacturing method of the TFT 201 and the TFT 202.

Formation of Gate Insulating Layer and Gate Metal Layer M1 (FIG. 12D)

Next, the second insulating film L2 is formed to cover the first insulating film L1 and the oxide semiconductor layer 27. The material of the second insulating film L2 may be similar to that of the first insulating film L1.

Then, a gate conductive film (having a thickness of, for example, equal to or more than 50 nm and equal to or less than 500 nm) (not illustrated) is formed on the second insulating film L2, and the gate conductive film is patterned by the known photolithography process. In this manner, as illustrated in FIG. 12D, the gate electrode GE1 of the TFT 201 is formed in the TFT formation region R1, and the gate electrode GE2 of the TFT 202 is formed in the TFT formation region R2. Although not illustrated, the gate bus line is also formed by using the gate conductive film. The material of the gate conductive film may be similar to that in the first embodiment.

Subsequently, the first insulating film L1 and the second insulating film L2 are patterned by using the resist mask (not illustrated) used for patterning the gate conductive film and the oxide semiconductor layer 27 as masks. Instead of the resist mask, the gate metal layer including the gate electrodes GE1 and GE2 may be used as a mask.

In this manner, as illustrated in FIG. 12D, in the TFT formation region R1, the first insulating film L1 and the second insulating film L2 are etched by using the resist mask or the gate electrode GE1 as the mask, thereby forming the gate insulating layer 19 between the gate electrode GE1 and the oxide semiconductor layer 17. In the TFT formation region R2 in which the gate insulating layer 19 has the layered structure including the lower layer 19A formed of the first insulating film L1 and the upper layer 19B formed of the second insulating film L2, the second insulating film L2 is patterned by using the resist mask or the gate electrode GE2 as the mask, thereby forming the gate insulating layer 29 including the second insulating film L2 between the gate electrode GE2 and the oxide semiconductor layer 27. Further, the first insulating film L1 is patterned by using the oxide semiconductor layer 27 as the mask, thereby forming the insulating layer 25 including the first insulating film L1 between the oxide semiconductor layer 27 and the lower insulating layer 5. In this example, the insulating layer 25 is formed of the same film as the lower layer 19A of the gate insulating layer 19, and is a layer having the same composition and thickness as those of the lower layer 19A.

According to the method, when viewed from the normal direction of the substrate 1, the side surfaces of the gate electrodes GE1 and GE2 are aligned with the side surfaces of the gate insulating layers 19 and 29, respectively. In addition, of the oxide semiconductor layer 17 and the oxide semiconductor layer 27, the regions not overlapping the gate metal layer M1 are exposed when viewed from the normal direction of the substrate 1.

Note that, in the present process, the oxide semiconductor layer 27 is subjected to etching of the first insulating film L1 and the second insulating film L2, but the oxide semiconductor layer 27 includes the upper layer Lb having a predetermined thickness, and thus damage to the high mobility layer Lm is suppressed. Further, since a sufficient total thickness T is ensured by the lower layer La, occurrence of step disconnection is suppressed even when the oxide semiconductor layer 27 is thinned by overetching in the present process.

Thereafter, the resistance lowering processing may be performed on the exposed regions of the oxide semiconductor layer 17 and the oxide semiconductor layer 27. The method of the resistance lowering processing may be similar to that in the first embodiment. In this manner, in the oxide semiconductor layer 17 and the oxide semiconductor layer 27, the regions not overlapping the gate metal layer M1 and the gate insulating layers 19 and 29 (exposed regions) become low-resistive regions having a lower specific resistance than that of the regions 17c and 27c overlapping the gate metal layer M1 and the gate insulating layers 19 and 29 (including the channel regions). The low-resistive region may be a conductive region (for example, sheet resistance equal to or less than 200 Ω/□).

Note that, after patterning the first insulating film L1 and the second insulating film L2, the gate conductive film may be formed and patterned.

Figure 12E:
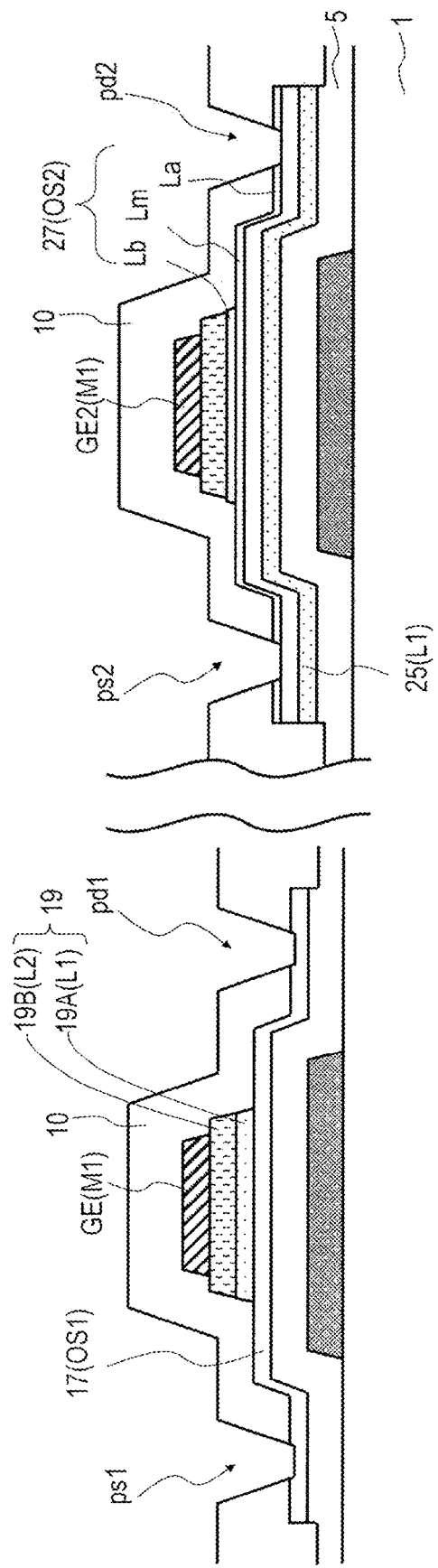
FIG. 12E is a process cross-sectional view illustrating an example of the manufacturing method of the TFT 201 and the TFT 202.

Formation of Interlayer Insulating Layer 10 (FIG. 12E)

Subsequently, the interlayer insulating layer 10 that covers the oxide semiconductor layer 17, the oxide semiconductor layer 27, the gate insulating layer19, the gate insulating layer 29, and the gate metal layer M1 is formed. The material and the formation method of the interlayer insulating layer 10 are similar to those in the first embodiment. Next, the interlayer insulating layer 10 is patterned. Thereby, as illustrated in FIG. 12E, the first opening ps1 and the second opening pd1 that each expose a part of the low-resistive region of the oxide semiconductor layer 17 are formed in the interlayer insulating layer 10 in the TFT formation region R1. Similarly, the first opening ps2 and the second opening pd2 that each expose a part of the low-resistive region of the oxide semiconductor layer 27 are formed in the interlayer insulating layer 10 in the TFT formation region R2.

Figure 12F:
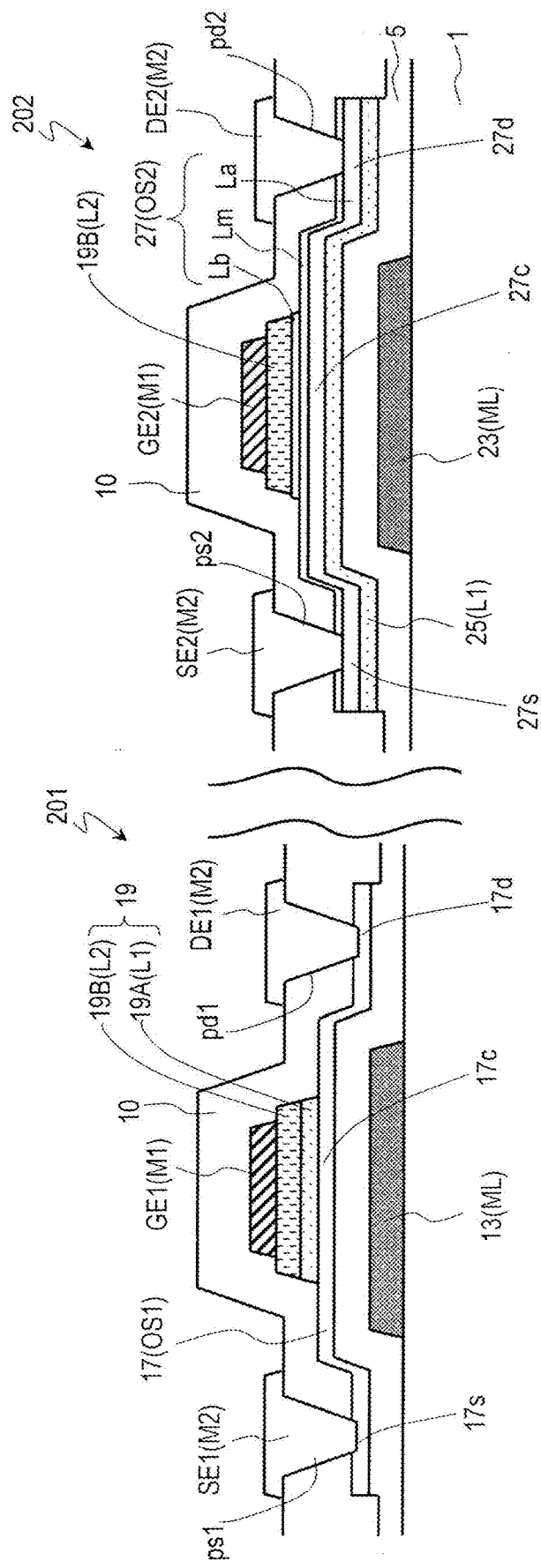
FIG. 12F is a process cross-sectional view illustrating an example of the manufacturing method of the TFT 201 and the TFT 202.

Formation of Source Metal Layer M2 (FIG. 12F)

Subsequently, a source conductive film (having a thickness of, for example, 50 nm or greater and 500 nm or less) (not illustrated) is formed on the interlayer insulating layer 10, and the source conductive film is patterned. In this manner, as illustrated in FIG. 12F, the source metal layer M2 including the source electrode SE1, the drain electrode DE1, the source electrode SE2, and the drain electrode DE2 is formed. Although not illustrated, the source bus line is also formed of the source conductive film. In this way, the TFT 201 and the TFT 202 are manufactured.

Figure 12G:
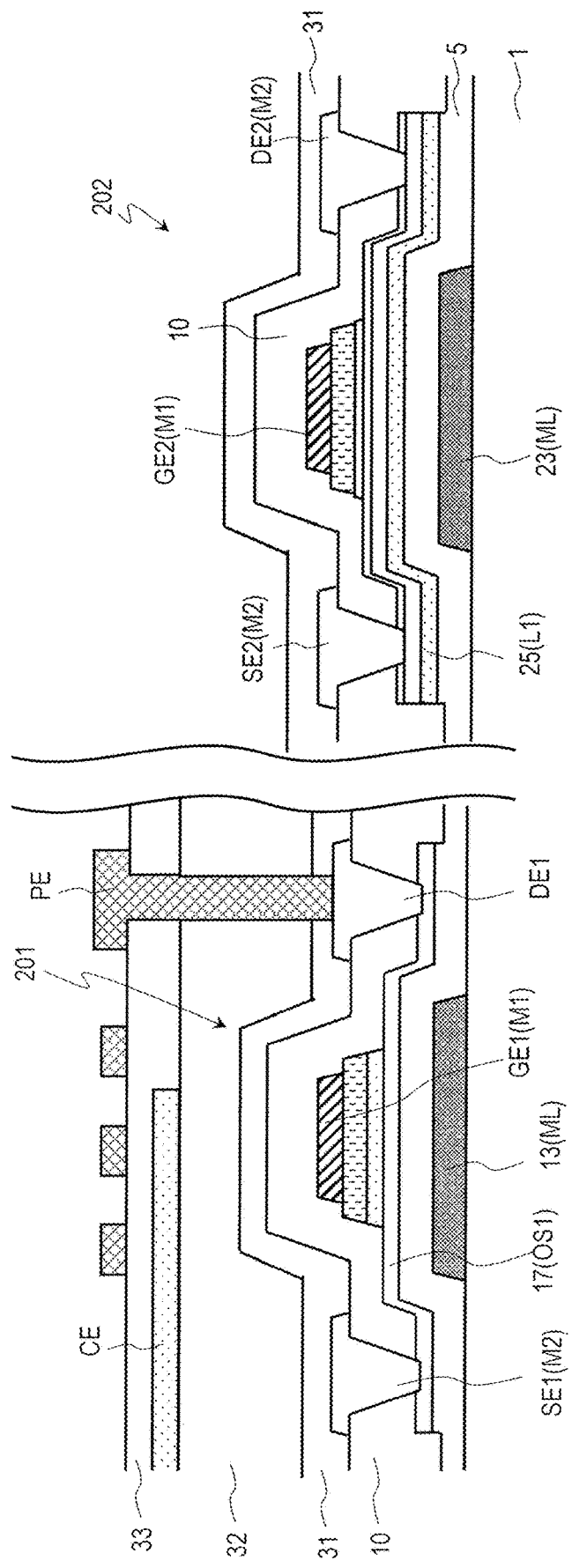
FIG. 12G is a process cross-sectional view illustrating an example of the manufacturing method of the TFT 201 and the TFT 202.

Formation of Common Electrode and Pixel Electrode (FIG. 12G)

When the TFT 201 is used as the pixel TFT, a common electrode CE and the pixel electrode PE are formed above the TFT 201.

First, an inorganic insulating layer 31 (having a thickness of, for example, equal to or greater than 100 nm and equal to or less than 500 nm) and an organic insulating layer 32 (having a thickness, for example, from 1 to 4 μm, preferably from 2 to 3 μm) are formed in this order to cover the interlayer insulating layer 10 and the source metal layer M2. For example, the same material as that of the interlayer insulating layer 10 may be used as the inorganic insulating layer 31. Here, as the inorganic insulating layer 31, an SiNx layer (having a thickness of 300 nm) is formed by the CVD. The organic insulating layer 32 may be, for example, an organic insulating film containing a photosensitive resin material (for example, an acrylic resin film).

Next, the organic insulating layer 32 is patterned. In this manner, in each pixel area, an opening that exposes a part of the inorganic insulating layer 31 is formed in the organic insulating layer 32. By this patterning, the entire portion of the organic insulating layer 32 located in the non-display region (including the TFT formation region R2) may be removed.

Subsequently, a first transparent conductive film (having a thickness of 20 to 300 nm) (not illustrated) is formed on the organic insulating layer 32 and patterned. In this manner, the common electrode CE is formed in the display region. As the first transparent conductive film, a metal oxide such as indium-zinc oxide, indium-tin oxide (ITO), ZnO, or the like can be used.

Subsequently, a dielectric layer 33 (having a thickness from 50 to 500 nm) is formed to cover the common electrode CE. A material of the dielectric layer 33 may be the same as the material exemplified as the material of the inorganic insulating layer 31. Here, as the dielectric layer 33, for example, a SiN film is formed by the CVD.

Subsequently, the dielectric layer 33 and the inorganic insulating layer 31 are patterned to form a pixel contact hole CHp that exposes the drain electrode DE1 of the TFT 201. In this example, the pixel contact hole CHp is formed of an opening in the dielectric layer 33, an opening in the organic insulating layer 32, and an opening in the inorganic insulating layer 31.

Then, a second transparent conductive film (having a thickness of 20 to 300 nm) (not illustrated) is formed on the dielectric layer 33 and in the pixel contact hole CHp. The second transparent conductive film can be formed using a material similar to that of the first transparent conductive film. Thereafter, the second transparent conductive film is patterned. In this manner, the pixel electrode PE is formed in each pixel area. The pixel electrode PE is connected to the drain electrode DE1 of the TFT 201 serving as the pixel TFT in the pixel contact hole CHp. In this manner, the active matrix substrate 1000 is manufactured.

Note that the pixel electrode PE and the common electrode CE may be disposed to face each other with the dielectric layer 33 interposed therebetween. Here, an example in which the common electrode CE is disposed on the substrate 1 side of the pixel electrode PE is illustrated, but the common electrode CE may be disposed on the pixel electrode PE with the dielectric layer 33 interposed therebetween.

Although the example in which the TFT 201 is used as the pixel TFT is described above, the TFT 201 may be used as a circuit TFT (for example, a drive circuit TFT). In this case, the gate electrode GE1, the source electrode SE1, and the drain electrode DE1 of the TFT 201 are each connected to predetermined wiring lines. The organic insulating layer 32 and the transparent conductive films may not be disposed above the TFT 201.

TFT Structure and Oxide Semiconductor

The TFT structure is not limited to the structure illustrated in the first and second embodiments. For example, although the TFT in the embodiments described above has a top contact structure in which the source and drain electrodes are in contact with the upper surface of the semiconductor layer, the TFT may have a bottom contact structure in which the source and drain electrodes are in contact with a lower surface of the semiconductor layer. Further, one or both of the source and drain electrodes may be formed between the active layer and the substrate (for example, in the lower metal layer).

The oxide semiconductor (also referred to as a metal oxide, or an oxide material) included in the oxide semiconductor layer of each TFT according to the present embodiment may be an amorphous oxide semiconductor or a crystalline oxide semiconductor including a crystalline portion. Examples of the crystalline oxide semiconductor include a polycrystalline oxide semiconductor, a microcrystalline oxide semiconductor, a crystalline oxide semiconductor having a c-axis oriented substantially perpendicular to the layer surface and the like.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. In a case where the oxide semiconductor layer has a dual-layer structure including an upper layer and a lower layer, an energy gap of the oxide semiconductor included in a layer positioned on the gate electrode side of the dual-structure (that is the lower layer in the case of the bottom gate structure, and the upper layer in the case of the top gate structure) may be smaller than an energy gap of the oxide semiconductor included in a layer positioned opposite to the gate electrode (that is the upper layer in the case of the bottom gate structure, and the lower layer in the case of the top gate structure). However, in a case where a difference in the energy gap between these layers is relatively small, the energy gap of the oxide semiconductor included in the layer positioned on the gate electrode side may be greater than the energy gap of the oxide semiconductor included in the layer positioned opposite to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, In:Ga:Zn=1:1:2 or the like. Such an oxide semiconductor layer can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed, for example, in JP 2014-007399 A described above, JP 2012-134475 A, JP 2014-209727 A, and the like. The entire contents of the disclosures of JP 2012-134475 A and JP 2014-209727 A are incorporated herein by reference. A TFT including an In—Ga—Zn—O based semiconductor layer has a high mobility (more than 20 times as compared to an a-Si TFT) and a low leakage current (less than 1/100 as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of indium (In), tin (Sn), and zinc (Zn). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, an In—W—Zn—O based semiconductor, and the like.

INDUSTRIAL APPLICABILITY

The embodiments of the present can be widely applied to various semiconductor devices provided with an oxide semiconductor TFT. The embodiments are also applied to various electronic devices, including circuit substrates such as an active matrix substrate, display devices such as a liquid crystal display device, an organic electroluminescence (EL) display device, an inorganic electroluminescence display device, and an MEMS display device, image taking devices such as an image sensor device, image input devices, fingerprint readers, semiconductor memories, and the like, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A semiconductor device, comprising:
a substrate; and
at least one first thin film transistor supported by the substrate,
at least one second thin film transistor supported by the substrate,
wherein each first thin film transistor includes
a lower electrode formed on the substrate,
a first oxide semiconductor layer disposed on the lower electrode with a lower insulating layer interposed between the first oxide semiconductor layer and the lower electrode, the first oxide semiconductor layer including, when viewed from a normal direction of the substrate, a channel region, a first contact region, and a second contact region, the first contact region and the second contact region being respectively located on both sides of the channel region,
a first gate electrode disposed on the channel region of the first oxide semiconductor layer with a first gate insulating layer interposed between the first gate electrode and the channel region,
a first source electrode electrically connected to the first contact region, and
a first drain electrode electrically connected to the second contact region,
when viewed from the normal direction of the substrate, at least a part of the channel region of the first oxide semiconductor layer overlaps the lower electrode, and at least one of the first contact region and the second contact region is located outside the lower electrode,
the channel region of the first oxide semiconductor layer has a layered structure including a lower layer, an upper layer located between the lower layer and the first gate insulating layer, and a high mobility layer disposed between the lower layer and the upper layer and having mobility higher than mobility of the lower layer and the upper layer,
in the channel region, a thickness tb of the upper layer is equal to or less than 1/3 of a thickness ta of the lower layer, and a thickness tm of the high mobility layer is equal to or less than 1/2 of the thickness ta of the lower layer,
each second thin film transistor includes
a second oxide semiconductor layer different from the first oxide semiconductor layer, and
a second gate electrode disposed on a part of the second oxide semiconductor layer with a second gate insulating layer interposed between the second gate electrode and the part of the second oxide semiconductor layer,
the second gate insulating layer has a layered structure including a first insulating film and a second insulating film disposed on the first insulating film, the first gate insulating layer of the first thin film transistor includes the second insulating film and does not include the first insulating film, and
the first thin film transistor further includes an insulating layer between the first oxide semiconductor layer and the lower insulating layer, the insulating layer being formed of the first insulating film.

2. The semiconductor device according to claim 1,
wherein the thickness tm of the high mobility layer is equal to or more than 4 nm and equal to or less than 12 nm.

3. The semiconductor device according to claim 1,
wherein the thickness tb of the upper layer is equal to or more than 1/10 of the thickness ta of the lower layer.

4. The semiconductor device according to claim 1,
wherein the thickness tb of the upper layer is equal to or more than 2/5 and equal to or less than 3/2 of the thickness tm of the high mobility layer.

5. The semiconductor device according to claim 1,
wherein a thickness of the channel region of the first oxide semiconductor layer is equal to or more than 30 nm.

6. The semiconductor device according to claim 1,
wherein the thickness tb of the upper layer is equal to or more than 2 nm and equal to or less than 12 nm.

7. The semiconductor device according to claim 1,
wherein, when viewed from the normal direction of the substrate, the first oxide semiconductor layer includes a low-resistive portion having a specific resistance smaller than a specific resistance of the channel region, the low-resistive portion being located between the channel region, and the first contact region and the second contact region, and
the low-resistive portion includes at least the high mobility layer and the lower layer.

8. The semiconductor device according to claim 7,
wherein the low-resistive portion is provided seperatly from, and does not include, the upper layer.

9. The semiconductor device according to claim 1,
wherein a thickness of the first gate insulating layer is smaller than a thickness of the lower insulating layer.

10. The semiconductor device according to claim 1,
wherein the lower electrode is electrically connected to the first gate electrode.

11. The semiconductor device according to claim 1,
wherein a side surface of the first oxide semiconductor layer and a side surface of the insulating layer are aligned with each other.

12. The semiconductor device according to claim 1,
wherein the second oxide semiconductor layer has mobility lower than the mobility of the high mobility layer of the first oxide semiconductor layer.

13. The semiconductor device according to claim 1,
wherein the semiconductor device is an active matrix substrate.

14. The semiconductor device according to claim 1,
wherein the semiconductor device is an active matrix substrate including a display region including a plurality of pixel areas, and a non-display region located in a periphery of the display region and including a peripheral circuit,
the active matrix substrate includes
a plurality of circuit TFTs disposed in the non-display region and constituting the peripheral circuit, and
a plurality of pixel TFTs each disposed in a corresponding one of the plurality of pixel areas,
the plurality of circuit TFTs include the at least one first thin film transistor, and the plurality of pixel TFTs include the at least one second thin film transistor.

\* \* \* \* \*